United States Patent
Yamada et al.

(10) Patent No.: US 6,559,662 B1
(45) Date of Patent: May 6, 2003

(54) SEMICONDUCTOR DEVICE TESTER AND SEMICONDUCTOR DEVICE TEST METHOD

(75) Inventors: Keizo Yamada, Tokyo (JP); Yousuke Itagaki, Tokyo (JP); Takeo Ushiki, Tokyo (JP); Tohru Tsujide, Tokyo (JP)

(73) Assignee: Fab Solutions, Inc., Kanagawa (JP)

( * ) Notice: Subject to any disclaimer, the term of this patent is extended or adjusted under 35 U.S.C. 154(b) by 0 days.

(21) Appl. No.: 09/722,074

(22) Filed: Nov. 27, 2000

(30) Foreign Application Priority Data

| Nov. 30, 1999 | (JP) | ............................................ 11-340696 |
| Jun. 26, 2000 | (JP) | ........................................ 2000-191818 |
| Oct. 31, 2000 | (JP) | ........................................ 2000-332754 |

(51) Int. Cl.$^7$ ............................................ G01R 31/305
(52) U.S. Cl. ........................................ 324/751; 250/310
(58) Field of Search ................................ 324/750, 751, 324/752, 753, 765, 767; 250/306, 307, 309, 251, 310, 311

(56) References Cited

U.S. PATENT DOCUMENTS

| 4,417,203 A | * | 11/1983 | Pfeiffer et al. .............. 324/501 |
| 4,980,639 A | * | 12/1990 | Yoshizawa et al. .......... 250/310 |
| 5,680,056 A | * | 10/1997 | Ito et al. ...................... 324/501 |
| 5,804,980 A | * | 9/1998 | Nikawa ....................... 324/538 |
| 5,877,498 A | * | 3/1999 | Sugimoto et al. ............ 250/307 |
| 6,005,400 A | * | 12/1999 | Thundat et al. .............. 324/752 |
| 6,177,681 B1 | * | 1/2001 | Nakamura ................ 250/341.4 |
| 6,232,787 B1 | * | 5/2001 | Lo et al. ...................... 250/310 |
| 6,323,484 B1 | * | 11/2001 | Ide et al. ...................... 250/251 |

FOREIGN PATENT DOCUMENTS

| JP | 4-62857 | 2/1992 |
| JP | 10-281746 | 10/1998 |
| JP | 2000-174077 | 6/2000 |

* cited by examiner

Primary Examiner—Kamand Cuneo
Assistant Examiner—Minh N. Tang
(74) Attorney, Agent, or Firm—Whitham, Curtis & Christofferson, P.C.

(57) ABSTRACT

A plurality of measuring positions on a sample are sequentially irradiated with electron beams having identical cross sectional shapes, currents produced in the sample when the individual measuring positions are irradiated with electron beams are measured and the measured currents or physical amounts derived from the measured currents are displayed on a two-dimensional plane as a function of measuring position.

31 Claims, 24 Drawing Sheets

DISTRIBUTION DISPLAY IN WAFER LEVEL

DISTRIBUTION DISPLAY OF ARBITRARY LOCATION

DISTRIBUTION IN SHOT LEVEL

DEFECTIVE MAP (DEFECTIVE POSITION DISPLAY)

DEFECTIVE MAP (DEFECTIVE MODE DISPLAY)

DEFECTIVE MAP (DIAMETER DISPLAY)

DEFECTIVE MAP (SYMBOL DISPLAY)

CONTOUR LINE DISPLAY OF HOLE DIAMETER

HOLE DIAMETER MAP (COLOR DISPLAY)

HOLE DIAMETER DISPLAY FOR EVERY WAFER

HOLE DIAMETER DISPLAY FOR EVERY SHOT

HOLE DIAMETER DISPLAY IN ARBITRARY REGIONS

| MAXIMUM | |
|---|---|
| MINIMUM | |
| AVERAGE VALUE | |
| 3 $\sigma$ | |

DISPLAY OF STATISTIC TYPICAL VALUE (WHOLE WAFER)

FIG.21

| MAXIMUM | |
|---|---|
| MINIMUM | |
| AVERAGE VALUE | |
| 3 $\sigma$ | |

DISPLAY OF STATISTIC TYPICAL VALUE (WHOLE SHOT)

FIG.22

| MAXIMUM | |
|---|---|
| MINIMUM | |
| AVERAGE VALUE | |
| 3 $\sigma$ | |

DISPLAY OF STATISTIC TYPICAL VALUE (SPECIFIC REGION)

FIG.23

SORTING ON CURRENT AMOUNT

DETERMINATION OF ETCHING CONDITION ROBUSTNESS

ETCHING ABNORMALITY DETECTION

SEMICONDUCTOR DEVICE TESTER AND SEMICONDUCTOR DEVICE TEST METHOD

CROSS REFERENCE TO RELATED APPLICATIONS

The present invention claims priority from Japanese Patent Applications No. 11-340696 filed Nov. 30, 1999, No. 2000-191818 filed Jun. 26, 2000 and No. 2000-332754 filed Oct. 31, 2000, the contents of which are incorporated herein by reference.

BACKGROUND OF THE INVENTION

1. Field of the Invention

The present invention relates to the test of a semiconductor device using an electron beam. Particularly, the present invention is suitable for use in a contact hole test.

2. Description of Related Art

In the recent semiconductor device, the size of semiconductor device is reduced more and more and the number of layers thereof is increased more and more in order to improve the performance of the semiconductor device. Therefore, the size of a structure to be formed by etching is in the order of 0.1 micron, so that it is particularly difficult to stably form fine contact-holes or via-holes. The contact-hole or via-hole is a hole formed in an insulating layer for electrically connecting a wiring formed on the insulating layer to a wiring underlying the insulating layer.

Since the size of such hole is reduced proportionally to the reduction of the size of semiconductor device and the operating clock frequency of semiconductor is increased, it is not enough for the contact-hole to merely provide an electric connection. That is, the transmission speed of electric signal through the contact-hole becomes a problem. For example, since a resistance value of one contact-hole is as large as 10 K$\Omega$ and a capacitance value between adjacent wiring is in the order of 0.01 pF or more, the time constant of the contact-hole becomes large enough to affect the rising speed of the clock with which the semiconductor device operates. If the time constant varies, the operating speed of a logic circuit varies. Therefore, it is necessary to wait until a decision is settled down. When the waiting time is long, there is a problem that a computation speed can not be improved even when the operating speed of elements constituting the logic circuit is improved.

In order to improve the operating speed of a whole semiconductor device, it is necessary to reduce the waiting time to as small value as possible by keeping an amount of delay of a rising edge of a clock signal, which is caused by the contact-hole, at a constant value or less. In order to realize such reduction of waiting time, it is necessary to manage the etching process for forming the contact-hole such that the diameter of the contact-hole becomes as designed. Further, if the diameter of the contact-hole is too large, it may contact with an adjacent element, causing unnecessary electric connection thereto to be formed. This is referred to as "leakage" and is one of defects of the semiconductor device. Therefore, it is necessary, in order to decide a contact-hole acceptable or not, to decide whether or not the diameter of the contact-hole is within a certain range with respect to a reference value.

In order to perform such decision, it has been usual that a bottom diameter of a contact-hole is measured by destroying a sample. As a first prior art method in such destructive measurement, there is a cross sectional SEM (Scanning Electron Microscope) measurement. In such method, a wafer is cut by using a glass cutter or FIB (Focused Ion Beam), etc., such that a cross section is taken exactly along a line passing through a center of the contact-hole. Then, the wafer is put on a sample table such that the cut plane becomes in parallel to the sample table and the cross section thereof is observed by a SEM to measure a longest distance of a bottom of the contact-hole on an image thereof Since the shape of the contact-hole is not always true circular, it is usual to measure distances in some directions and decide an average distance as the diameter of the bottom of the contact-hole. In order to measure an exact absolute diameter of the bottom, it is usual to compare a standard distance on the image with the displayed distance of the bottom of the contact-hole by observing the standard distance and the distance of the sample, simultaneously.

In a second prior art method, an oxide film formed on a surface of a sample, in which a contact-hole is formed, is removed by etching or CMP (Chemical/Mechanical Polishing), etc. On the surface of the sample from which the oxide film is removed, there is a mark left, which is produced when the contact-hole is etched and reflects a shape of a bottom of the contact-hole. The sample is put on a sample table such that the etching mark becomes in parallel to the sample table and the etching mark is observed by a SEM to measure a distance of the etching mark. The second method is featured by the fact that the preciseness of the measurement is high compared with the first method since the preciseness does not depend on the preciseness of cutting the sample.

However, these prior art methods are destructive methods as mentioned previously and there is a problem that it is impossible to directly measure a product. Further, since the SEM measurement is performed manually, there is another problem that the measurement takes long time and it is impossible to process a number of samples at high speed. Therefore, there is a further problem that the number of measuring points for each wafer is very small and the reliability of measurement is degraded.

As means for solving these problem, JP 10-281746A filed by the assignee of the present invention discloses a technique in which a current produced by electron beam passed through a contact-hole and reached a substrate is detected, from which a position and a size of a bottom portion of the contact-hole are detected. JP 4-62857A discloses a technique in which a sample is irradiated with not electron beam but ion beam to observe a secondary electron image by measuring a substrate current produced by the irradiation of ion beam. In JP 2000-174077A published on Jun. 23, 2000, a technique for testing a number of contact-holes within a short time is disclosed, in which a semiconductor wafer is sectioned to a plurality of regions and a ratio of normal contact-hole in each region is tested. Further, JP 2000-174077A discloses a technique for displaying the measured ratios correspondingly to the respective regions.

SUMMARY OF THE INVENTION

An object of the present invention is to provide a semiconductor tester and a semiconductor test method, which is capable of testing a semiconductor device at high speed without destroying the semiconductor device, by improving the technique for detecting a substrate current produced by irradiating the semiconductor device with electron beam.

The present invention is featured by that, by utilizing the principle of measurement of characteristics of a semiconductor device including a structure thereof on the basis of an amount of current produced in a sample by irradiation of low energy electron beam, characteristics of an arbitrary region of the sample is measured at high speed without destroying the sample by setting a measurement mode according to a measuring object.

That is, according to a first aspect of the present invention, a semiconductor device is provided, which comprises means for sequentially irradiating a plurality of measuring positions on a sample with electron beams having identical cross sectional shapes, means for measuring a current produced in the sample when individual measuring positions are irradiated with electron beams, and display means for displaying the measured currents or physical amounts derived from the measured currents on a two-dimensional plane as not mere numerical values but a function of measuring position and measuring region. The measuring means preferably measures a total amount of currents produced when the individual measuring positions of the sample are irradiated with an electron beam.

The present invention can be utilized in testing various semiconductor devices and, particularly, in testing contact-holes of various semiconductor devices. In the latter case, the irradiating means preferably irradiates positions of a semiconductor wafer having a single contact-hole or a plurality of contact-holes, which are arranged along an arbitrary axis crossing the wafer with a predetermined interval, preferably, with an interval having a predetermined period, with electron beam.

A stepper exposing device may be used as the irradiating means. In such case, it is preferable to irradiate positions of the wafer, which are separated with a predetermined interval in a shot region that is a range exposed in one stepper exposure, with electron beam. More preferably, positions, which are arranged with a predetermined interval along an arbitrary axis passing through a scribe region determining a region of one semiconductor device, are irradiated with electron beam.

The display means preferably includes means for evaluating an amount of current in each of the measuring positions according to a quality determination algorithm determined every semiconductor device and displaying specific symbols on a two-dimensional plane simulating a wafer shape correspondingly to normal or defective positions. It may further include means for displaying a specific symbol corresponding to a defective mode according to the defective mode determined every semiconductor device.

Further, the display means may include means for evaluating an amount of current in each of the measuring positions according to a quality determination algorithm determined every semiconductor device and displaying values or substantial values of diameters of contact-holes on a two-dimensional plane simulating a wafer shape correspondingly to the measuring positions. In such case, it may be possible to display a symbol indicating a range of the contact-hole diameter, to display values of the contact-hole diameter as contours, to display colors indicating ranges of values of the contact-hole diameters or to display magnitudes of measured currents corresponding to spacial frequencies on a two-dimensional plane by calculating the spacial frequencies of the measured current amounts. Alternatively, it may be possible to display a ratio of contact-hole diameter every wafer as a function of the contact-hole diameter, to display a ratio of contact-hole diameter every shot of the stepper exposure as a function of the contact-hole diameter, to display a ratio of contact-hole diameter every chip on a wafer as a function of the contact-hole or to display a statistical amount of such as maximum diameter, minimum diameter, average diameter, standard deviation and/or deviation from a standard diameter of the contact-hole every wafer.

The present invention can be utilized in a test of an electrically conductive substrate, in which holes are formed by using a photo resist formed on the substrate as a mask. In such case, the present invention preferably includes means for extracting contact-holes having the same designed size from a layout information of a mask used in exposure and assigning contact-holes to be tested every chip within a range, which is exposed simultaneously when it is exposed during the exposure of the photo resist.

The present invention can be utilized in a test of an element having contact-holes whose depths are different. In such case, the present invention preferably includes means for classifying the contact-holes every depth thereof on the basis of design data of these contact holes and controlling the irradiating means such that the contact-holes in each group are irradiated with electron beam. In such case, the display means preferably include means for simultaneously displaying a design sheet corresponding to the depths of the respective contact-holes and a secondary electron image representing a surface of the element.

It is possible to measure a plurality of individual measuring positions not one by one but at once. That is, the present invention may include means for classifying a plurality of measuring positions on the sample to a plurality of regions and controlling the irradiating means such that every region is irradiated with electron beam and the display means may include average value display means for displaying an amount of current measured in every region as an average amount of currents obtained in a plurality of measuring positions contained in the region.

Further, the irradiating means is capable of switching an operation mode between a first mode in which the plurality of measuring positions classified to a plurality of regions and every region is irradiated with electron beam and a second mode in which individual measuring positions are irradiated with electron beam and may include control means for setting the irradiating means to the first mode, classifying the amounts of currents measured by the measuring means according to the magnitudes thereof, selecting some of the regions according to a predetermined reference, setting the irradiating means to the second mode for the selected regions and repeating the measurement.

The present invention may include memory means storing measuring position patterns suitable for items to be tested, means for reading one of the measuring position pattern from the memory means corresponding to a test item selected by an operator, converting the measuring positions into coordinates for which the test is performed practically by extending the measuring pattern suitably for the size of an object to be measured and means for controlling the irradiating means such that the measuring positions assigned are irradiated with electron beam in an assigned sequence thereof on the basis of the practical coordinates obtained by the converting means.

The present invention can be utilized to determine process conditions for a mass-production of semiconductor device. In order to realize the mass-production, a plurality of test samples, which are formed by using mutually different process conditions and contain a plurality of regions in which test objects are formed in different densities, are used as the sample and the semiconductor device tester preferably includes means for comparing the amounts of currents measured by the measuring means when the plurality of the regions are irradiated with electron beam between process conditions, memory means for storing a result of comparison from the comparing means with using the process conditions used for the test samples as parameters and means for selecting an optimal process condition from the result of comparison related to the plurality of the test sample stored in the memory means.

In the latter case, the plurality of the regions may include first regions in which the objects to be tested are formed in high density and second regions in which the objects to be tested are formed discretely. In a case where the objects to be tested are contact-holes, the comparing means preferably includes means for comparing an amount of current flowing in one contact-hole within the first region with an amount of current flowing in one discrete contact-hole within the second region. Alternatively, the comparing means may include means for comparing an amount of current flowing in one contact-hole within the first region, which is obtained by normalizing currents flowing in a plurality of contact-holes within the first region with the number of the contact-holes with an amount of current flowing in one discrete contact-hole within the second region.

Similar test can be performed for wiring patterns. Further, the plurality of the regions may include a first region in which objects to be tested are formed in relatively high density, a second region in which objects to be tested in relatively low density and a third region in which discrete objects are formed.

The present invention can be utilized in a process test in a mass-production. In such case, the semiconductor device tester of the present invention preferably includes means for specifying a plurality of regions of the sample in which objects to be tested in different densities, means for comparing currents measured by the measuring means when the plurality of the regions are irradiated with electron beam, respectively, and means for alarming a fabrication step performed for the sample as abnormal when the result of comparison from the comparing means does not satisfy a predetermined condition.

The present invention can be executed by using not only an apparatus dedicated thereto but also an apparatus such as an electron beam exposing apparatus capable of irradiating specific region with electron beam or by a data processing using a general information processor.

That is, according to a second aspect of the present invention, a semiconductor device testing method is provided, which is featured by comprising a first step of measuring currents flowing in a sample by irradiating a plurality of measuring positions on the sample with electron beams sequentially such that the electron beams have identical cross sectional areas and storing the respective measuring positions and the measured currents and a second step of reading the currents and the measuring positions and displaying the currents or physical amount derived from the currents on a two dimensional plane as a function of the measuring positions.

BRIEF DESCRIPTION OF THE DRAWINGS

FIG. 21 shows an example of display of a typical statistical value as a table;

FIG. 22 shows another example of display of a typical statistical value as a table;

FIG. 23 shows another example of display of a typical statistical value as a table;

DETAILED DESCRIPTION OF THE PREFERRED EMBODIMENTS

Figure 1:
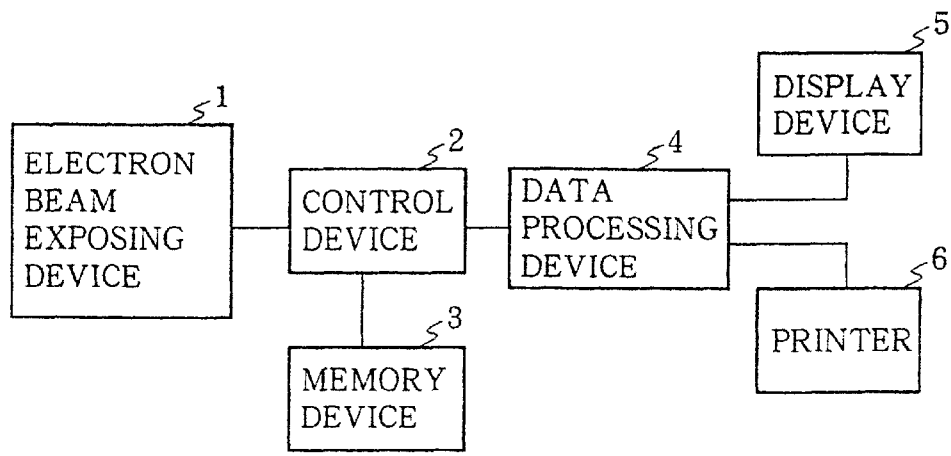
FIG. 1 is a block diagram showing a first embodiment of the present invention, which uses an electron beam exposing apparatus.

FIG. 1 is a block diagram showing an embodiment of the present invention utilizing an electron beam exposing apparatus 1. A control device 2, which controls an exposure and collects data, is connected to the electron beam exposing apparatus 1. A memory device 3 is connected to the control device 2 to which a data processing unit 4 is connected always or on demand. A display device 5 and a printer 6 are connected to the data processing unit 4.

In addition to the original exposing function, the electron beam exposing apparatus 1 is capable of sequentially irradiating a plurality of measuring positions on a sample with electron beams having identical cross sectional shapes. The control device 2 controls an operation of the electron beam exposing apparatus 1 and, during a device test, measures current produced in the sample when the respective measuring positions are irradiated with electron beam and stores the measuring positions and amounts of current measured at the respective measuring positions in the memory device 3. The data processing unit 4 reads out the currents and the measuring positions from the memory device 3 through the control device 2 and two-dimensionally displays the currents or physical amounts derived from the currents as a function of measuring position. The data processing unit 4 outputs the function to the printer 6 on demand.

The measured data may be stored in the memory device 3 as they are. However, the memory device 3 may store the measured data after performing an arithmetic operation such as integrating/adding operation of the measured data or an averaging operation. The operations to be performed by the control device 2 and the data processing unit 4 may be performed by a single device. Further, instead of the memory device 3 provided independently for the electron beam exposing apparatus 1, a memory, which collectively stores respective data of a fabrication line for which the electron beam exposing apparatus 1 is arranged, can be utilized.

Figure 2:
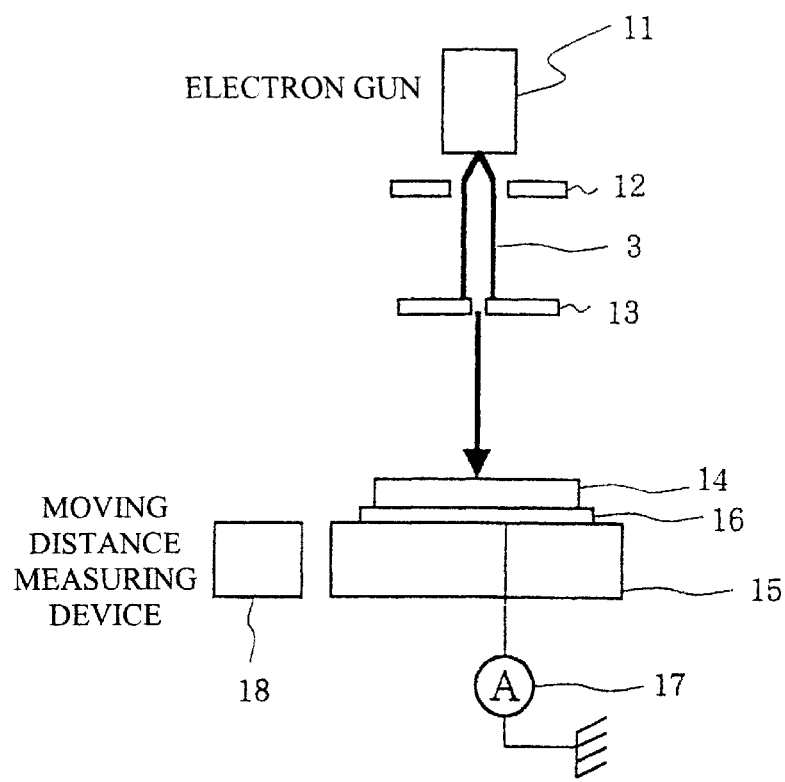
FIG. 2 shows the electron beam exposing apparatus in detail.

FIG. 2 schematically shows a construction of the electron beam exposing apparatus 1. The electron beam exposing apparatus 1 includes an electron gun 11 for radiating electron beam, a condenser lens 12 for collimating electron beam radiated from the electron gun 12 to a parallel beam, an aperture plate 13 for collimating the parallel beam to a thin electron beam, a stage 15 for supporting a sample 14, an electrode 16 for deriving current from the sample, an ammeter 17 for measuring the current derived by the electrode 16 and a moving distance measuring device 18 for obtaining a positional relation between the sample 14 and the electron beam irradiating the sample. When the ammeter 17 has a bias power source therein, it is possible to bias the sample 14 by a bias voltage from the bias power source.

Electron beams radiated from the electron gun 11 and having a constant current are once made parallel beams by the condenser lens 12 and, then, collimated to a parallel electron beam having a desired shape or size by an aperture formed in the aperture plate 13 and determining a size of the electron beam used to irradiate the sample. The electron beam passed through the aperture of the aperture plate 13 irradiates the sample 14 vertically. In a surface of the sample 14 irradiated with the electron beam, secondary electrons are produced correspondingly to a surface condition of the sample 14. Since the sample 14 to be tested is electrically conductive, electric field can not reside in the sample 14. Therefore, current flows in the sample 14 for compensating for secondary electrons emitted from the sample such that the potential gradient in the sample 14 becomes zero or correspondingly to an amount of electron directly flown into the sample. The current is measured by the electrode 16, which is in contact with the sample 14. Acceleration voltage and current of the electron beam irradiating the sample 14 are in a range from several hundreds volts to several kilo volts and in a range from the order of pico ampere to the order of nano ampere, respectively. The moving distance measuring device 18 is constructed with a precise measuring device using such as laser interference, which can measure a moving distance of the sample with preciseness in angstrom unit. The measured position and current are stored in the memory 3 (FIG. 1) together with an identifier of the wafer.

The movement of electron beam to a measuring location may be achieved by moving the sample 14, scanning it with electron beam or moving the sample while scanning it with electron beam. The movement of the sample 14 may be achieved by moving the stage 15 or achieved independently from the stage 15.

Although the aperture plate 13 is not always essential in the embodiment, it is possible to make a shape of the irradiating region arbitrary when the aperture plate 13 is used.

Figure 3:
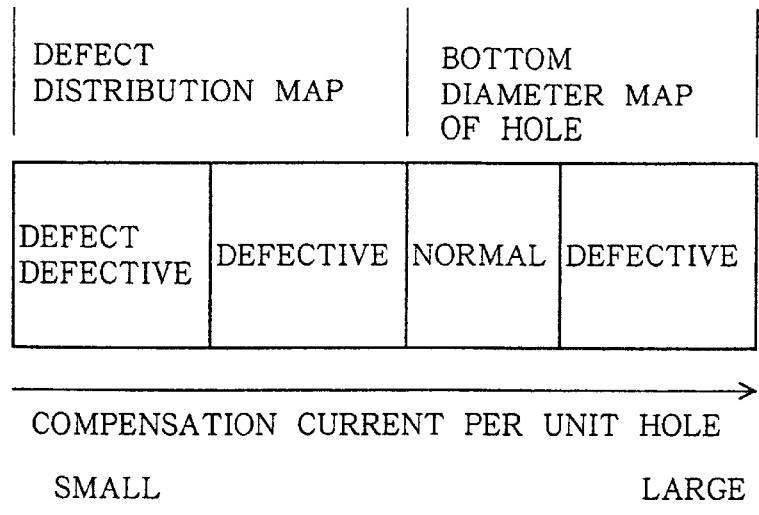
FIG. 3 shows a relation between compensation current and a defective contact-hole.

FIG. 3 is a table showing a relation between an amount of current measured in a certain specific semiconductor device and a contact-hole forming condition. The term "normal product" in the table is defined by a contact-hole having a bottom of a material, which is not an insulating material, and a bottom diameter within a range from a certain predetermined minimum diameter to a certain predetermined maximum diameter. As shown in FIG. 3, a region of the wafer in which no current flows corresponds to a product, which is completely defective, a region in which a little current flows corresponds to a product, which has a defect in a portion, which may include an opening portion partially, a region in which a predetermined amount of current flows corresponds to a normal product and a region in which current larger than the predetermined current flows corresponds to a defective product since the size of the contact-hole is too large. Therefore, it is possible to determine the quality of a sample under test by determining whether or not the sample under test shows the current amount within the range of normal product shown in FIG. 3.

FIG'S. 4 to 6 shows examples of the shape of electron beam irradiating a sample.

Figure 4:
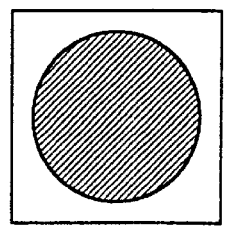
FIG. 4 shows an example of configuration of a region to be irradiated with electron beam.

Basically, electron beam irradiates the sample such that a contact-hole is completely included in a cross sectional area of the electron beam, as shown in FIG. 4. In such case, it is possible to use a thick electron beam having cross sectional area large enough to completely cover the contact-hole at once or to use a thin electron beam such that it covers the measuring region as a time-average of thin beam.

Figure 5:
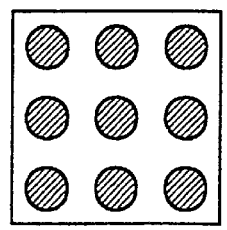
FIG. 5 shows another example of configuration of the region to be irradiated with electron beam.

FIG. 5 shows a case where a plurality of contact-holes are measured simultaneously. It is general that the distribution of etching reaction varies macroscopically except local substance such as dust. Therefore, it is possible to obtain a significant measuring result regardless of whether diameters of contact-holes are measured one by one or an average diameter of a plurality of contact-holes is measured. Thus, it is possible to measure the distribution by simultaneously measuring 10 or 100 contact-holes or more. The contact-holes contained in one measuring region may be arranged in line like memories or arranged randomly. However, in order to measure the etching distribution, the regions should have identical patterns or contain contact-holes identical in number.

Figure 6:
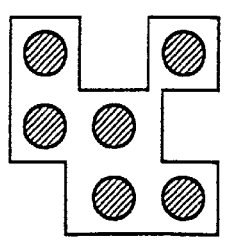
FIG. 6 shows another example of configuration of the region to be irradiated with electron beam.

The cross sectional shape of irradiating electron beam can be obtained by changing the aperture of the aperture plate, which determines the shape of the electron beam, to one corresponding to a shape of the object to be measured. For example, it is possible to measure a plurality of mutually separated contact-holes simultaneously as shown in FIG. 6. Particularly, in a logic device, there may cases where diffused substances in bottoms of contact-holes are different, materials of the bottoms thereof are different, electric connections thereof are different with or without the bottoms being grounded through a substrate, even if the contact-holes exist in the same layer. In any of these cases, contact-holes in which identical currents flow in normal state are grouped and a region including the grouped contact-holes is irradiated with thick electron beam simultaneously or scanned with thin electron beam with time.

Figure 7:
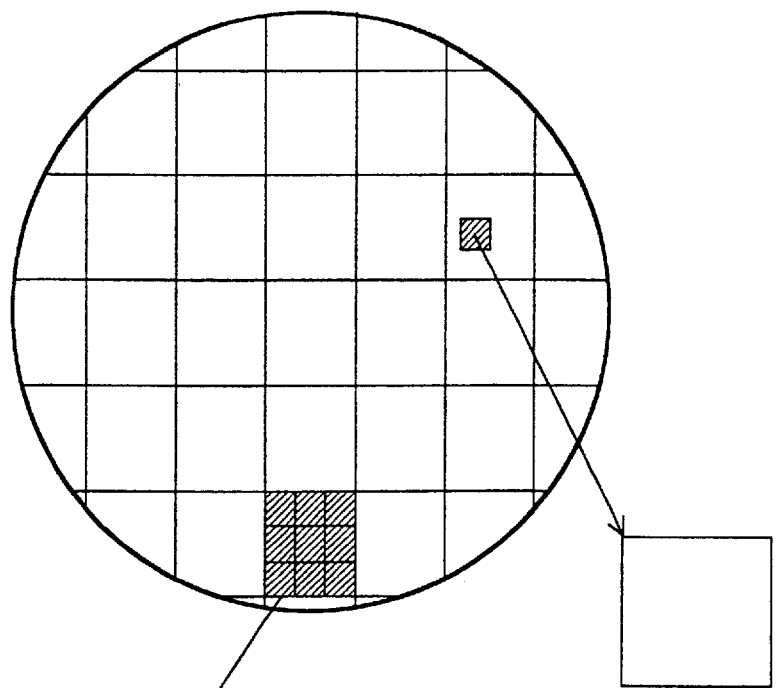
FIG. 7 shows a region in which a plane distribution of measuring positions for measuring contact-hole diameter.
Figure 7:
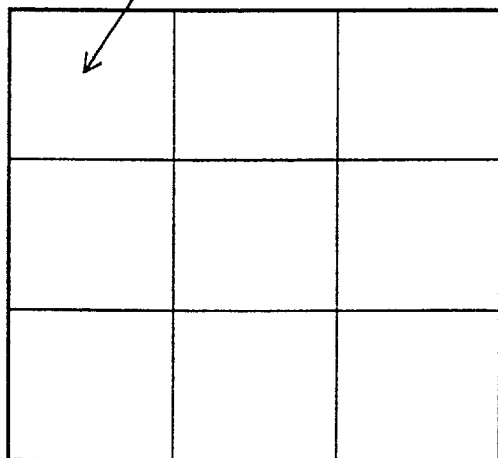

FIG. 7 shows an example of selecting measuring points when the etching distribution is to be checked. In order to develop the etching process, it is necessary to know the etching distribution of the whole wafer, the shot level distribution necessary to know the influence of characteristics of an exposing device such as stepper, the etching distribution within a chip or the etching distribution in an arbitrary region.

Figure 8A:
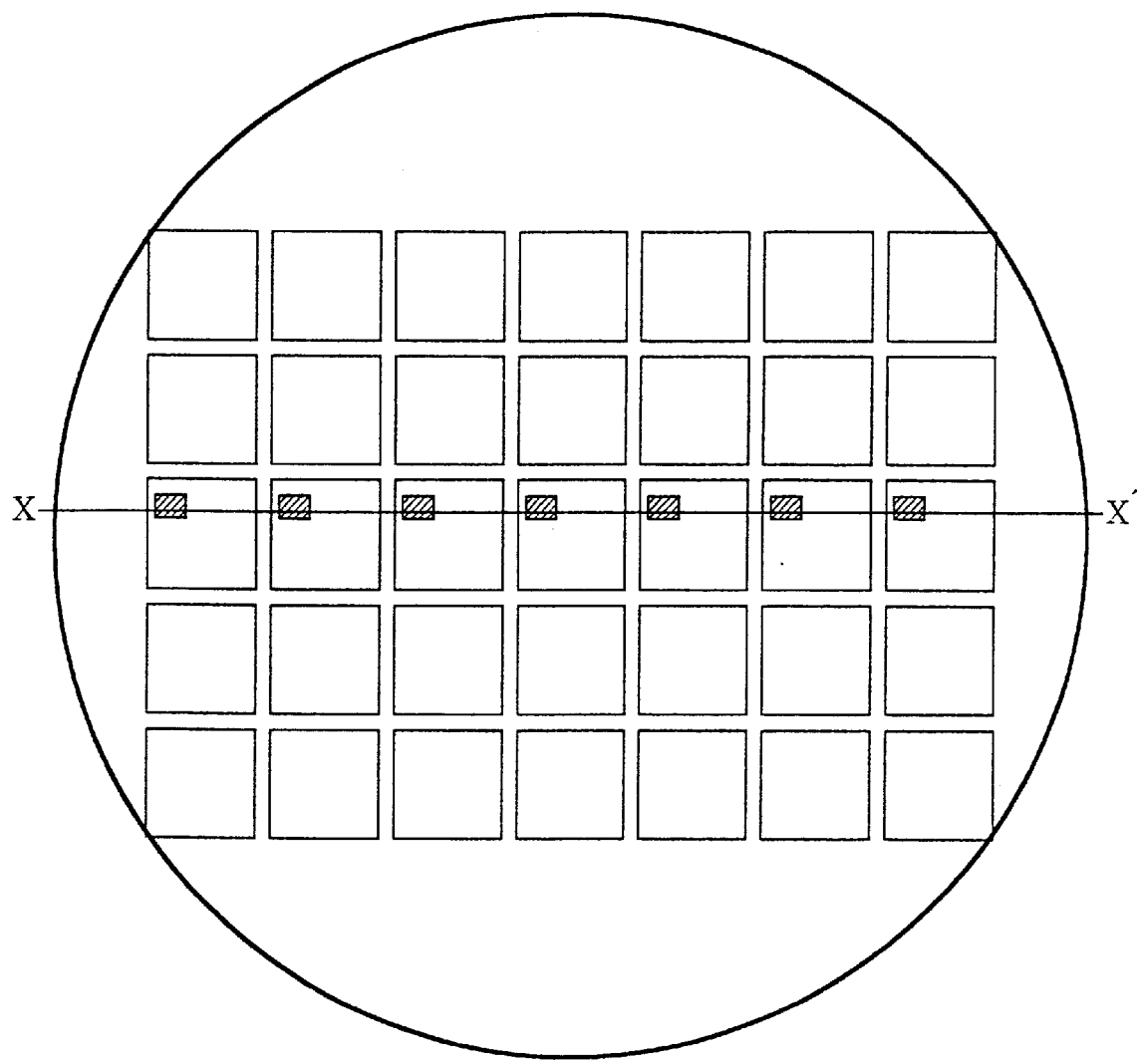
FIG. 8a shows measuring points on a wafer as an example of measurement of distribution within a wafer surface and FIG. 8b is a graph showing currents at the respective measuring points.
Figure 8B:
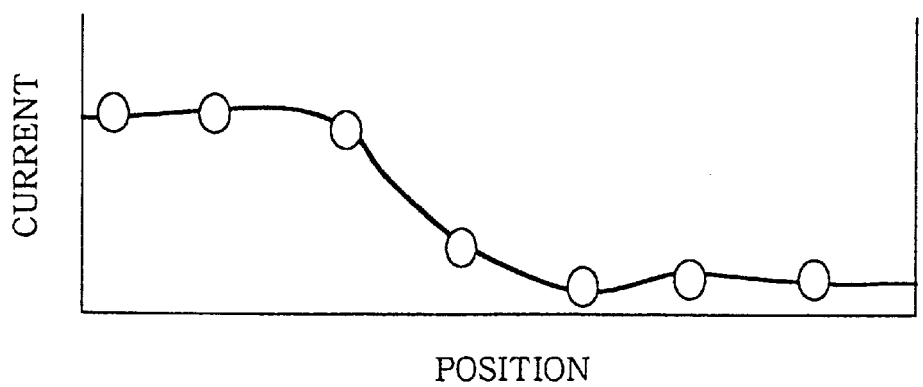

FIG. 8a shows measuring points on a wafer as an example of measurement of the etching distribution in a wafer surface and FIG. 8b shows a plot of current measured at the respective measuring points. It is general that an etching is performed on coaxial circles within a sample surface. On the other hand, in a case of a semiconductor integrated circuit device, it is usual that a plurality of semiconductor integrated circuits having identical functions are arranged on a wafer with a constant interval. In such case, the measuring points are arranged along a straight line X–X' passing through a center of the sample as shown in FIG. 8a. Since contact-holes having identical natures should be formed in the respective measuring points, it is preferable to select contact-hole patterns having identical relative coordinates in different chips as the measuring points. The graph shown in FIG. 8b is obtained by plotting currents obtained in the respective measuring points when specific regions having identical relative coordinates having, as original points, centers of respective chips having identical patterns and arranged in the wafer with an equidistant interval are measured.

Current observed under a certain electron beam irradiation is proportional to a bottom area of the contact-hole. Therefore, a large current flows in a region including a contact-hole having a large bottom area and a small current flows in a region including a contact-hole having a small bottom area or an incomplete contact-hole having no bottom area. The graph in FIG. 8b shows a result of test performed for a sample which has many defective holes in the right half portion thereof and normal holes in the left half portion thereof. As is clear from FIG. 8b, the current measured in the right hand portion of the sample is small indicating that there are many defective holes therein and the current measured in the left side portion of the sample is large and tends to show a constant value, indicating that the normal holes in the left hand portion of the sample.

There may be a case where contact-holes are not arranged along the straight line X–X'. In such case, it may be possible to arrange the measuring points such that electron beam moves passing along bottoms of the contact-holes.

Figures 9A, 9B:
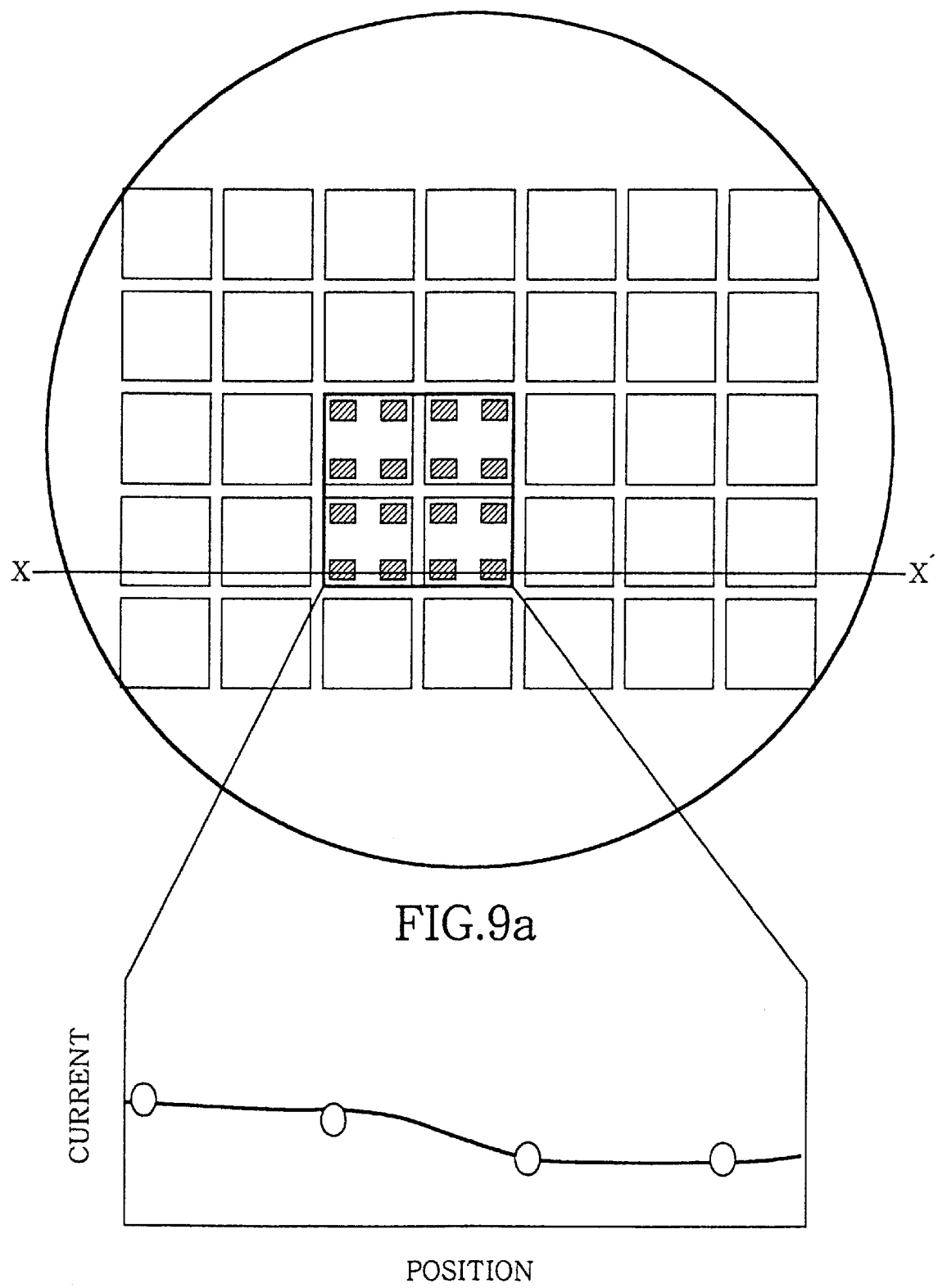
FIG. 9a shows measuring points on a wafer as an example of measurement of distribution within a stepper shot and FIG. 9b is a graph showing currents at the respective measuring points.

FIG. 9a shows measuring points arranged within respective shots on a wafer as an example of distribution measurement within stepper shots and FIG. 9b is a graph obtained by plotting currents obtained in the respective measuring points. In a case of a small chip, one shot of the stepper is a region containing several hundreds chips and, in a case of a large chip such as a system LSI having four sides each exceeding 1 cm, one shot may contain one LSI. In the example shown in FIG'S. 9a and 9b, four chips constitute one shot. The stepper, which is the exposing device, has specific positional deviation or distortion of transferred image. Such deviation or distortion reflects the etching distribution within one shot. Therefore, it is possible, by picking up an etching distribution in one shot, to determine whether or not the etching distribution is due to the stepper. That is, when a correlation of distribution is obtained every shot and there is a correlation between the shots, it is possible to estimate that the distortion or deviation is caused by shot. In the case of 1 shot, regions in 1 chip, which have identical structures, are selected as the measuring points. Since there is always a repeated portion in a semiconductor device, such regions are preferably used. If there is no such repeated portion, one contact-hole, which is designed to have identical diameter, is selected as an object to be tested.

The graph in FIG. 9b shows currents obtained in the regions arranged along the line X–X' as a function of the measuring position. By measuring currents in the measuring points in other Y coordinates and displaying it as a three dimensional map, it is possible to understand the in-plane distribution within shot at a glance.

Figures 10A, 10B:
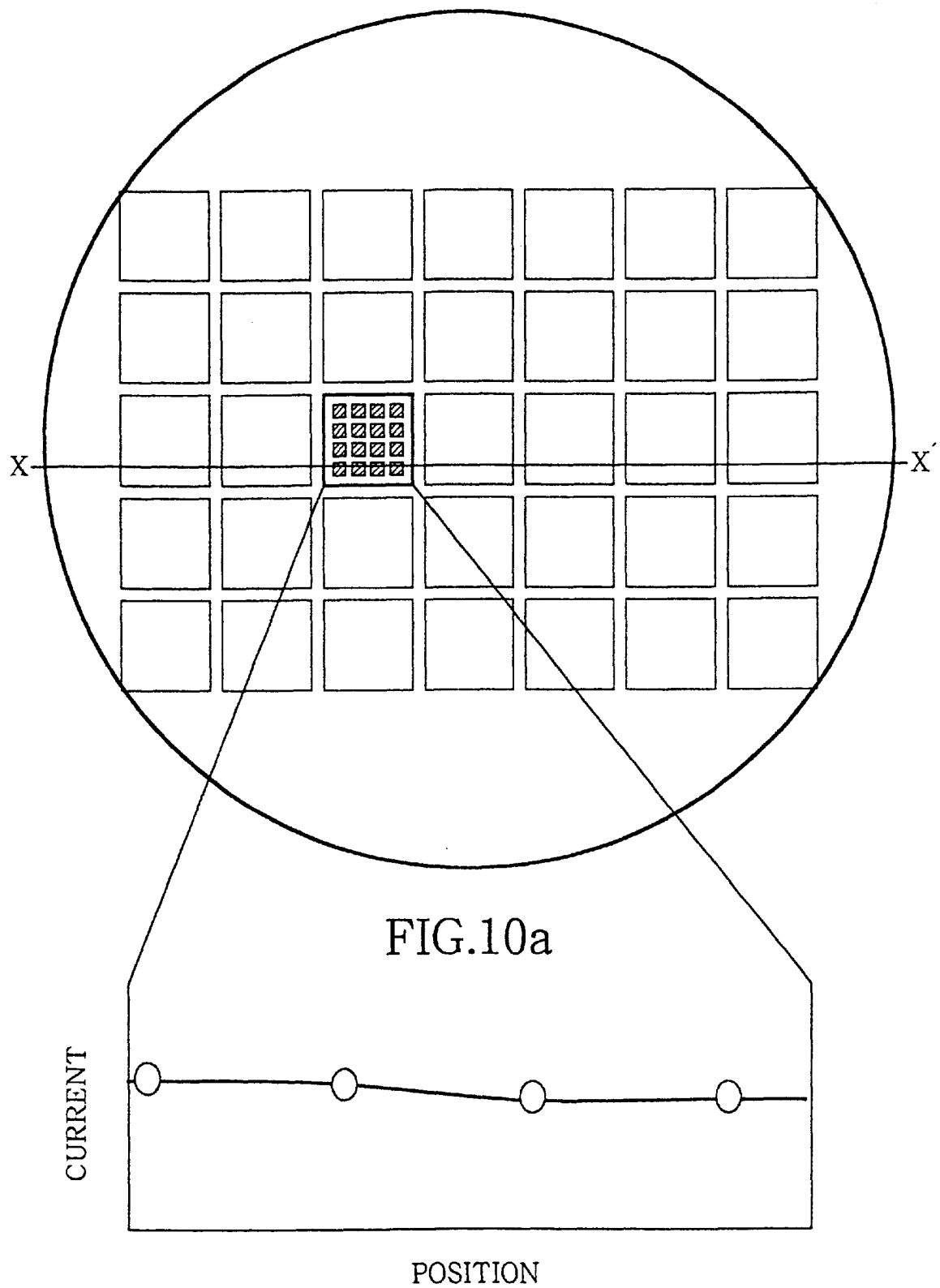
FIG. 10a shows measuring points on a wafer as an example of measurement of distribution within a chip and FIG. 10b is a graph showing currents at the respective measuring points.

FIG. 10a shows measuring points arranged within respective shots on a wafer as an example of in-chip distribution measurement within a chip and FIG. 10b is a graph showing currents obtained in the respective measuring points. In a semiconductor device such as DRAM having many repeated structures, contact-holes may exist in any portions in a chip similarly. Therefore, it is possible to measure distribution at almost arbitrary position. The measuring points are set with a constant interval as shown in FIG. 10a. In the case where contact-holes exist at random as in a logic device, the interval of positions of the contact-holes is not always constant. In such case, the electron beam irradiating position is regulated to set it to the positions of the contact-holes.

Figure 11:
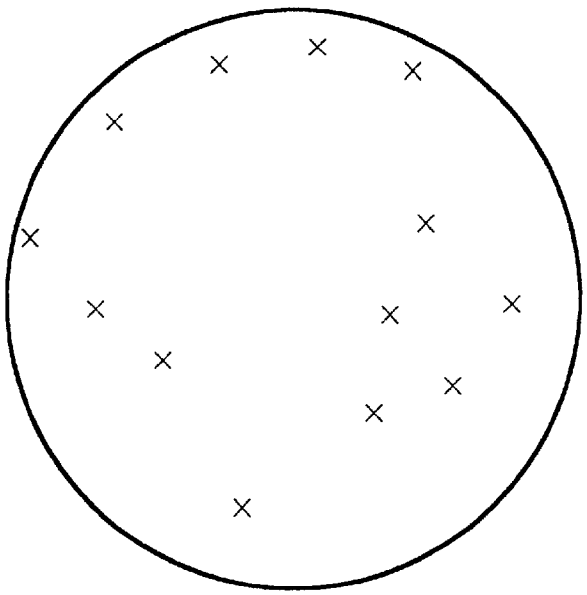
FIG. 11 shows an example of a display of positions of measuring points, which are decided as defective, on a wafer map.

FIG. 11 shows positions of the measuring points, which are determined as defective from the amount of currents obtained thereat, displayed on a wafer map. In this case, a larger number of measuring points are employed compared with the case where one measuring point in each chip described with reference to FIG'S. 8a and 8b.

The measuring points may be selected in other ways and it is possible to arbitrarily select measuring points according to objects. Further, it is possible 4; to not display all of measuring points on a display device but display only normal products or abnormal products. Examples of display method will be described next.

Figure 12:
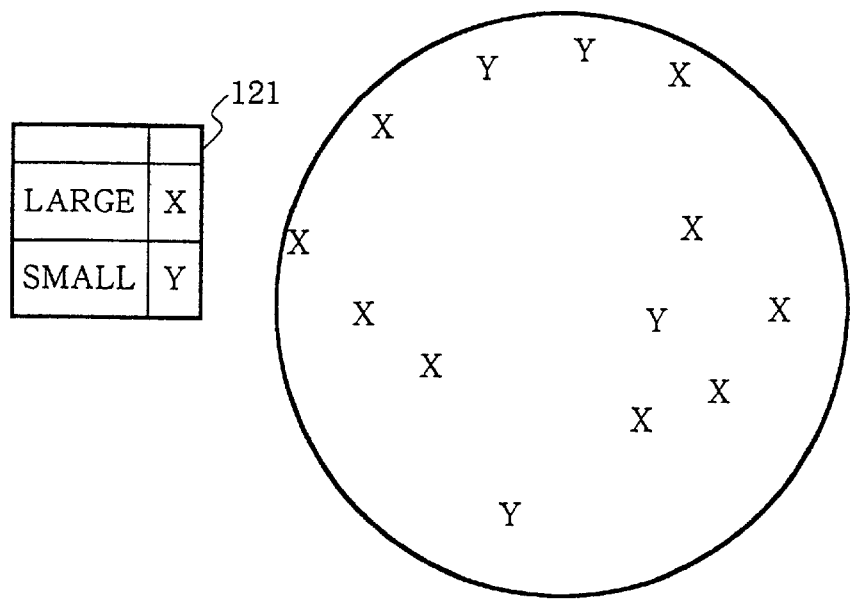
FIG. 12 shows an example of a defective mode display.

FIG. 12 shows an example of a defective mode display, that is, a display format for selectively displaying only defective mode. The defective mode includes, for example, a non-opening mode for a case where no hole is formed, a mode for a case where extraordinary substance is left on a bottom of an opening, a short mode for a case where, though a hole is etched up to a bottom thereof, a diameter of the bottom is short, a mode for a case where a bottom diameter of a hole is within a tolerable range, and a mode for a case where a bottom diameter of a hole is too large. These modes are distinguished from each other according to a constant algorithm and displayed. Since reference values for these modes are different every product, the reference values are determined for every product and the quality of contact-holes is classified according thereto and displayed. The classifying method may be based on the amount of current or a correlation between a layout information and other device characteristics. In order to clarify a symbol representing the defective mode and a content of defect, it is preferable to display a correspondence table 121 together.

Figure 13:
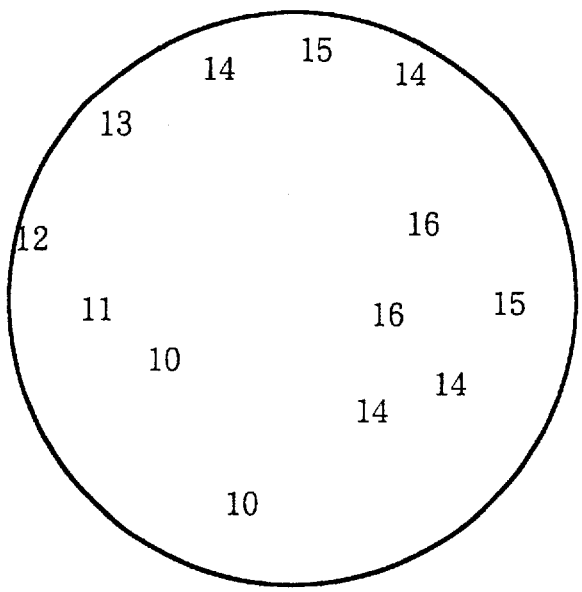
FIG. 13 shows another example of a defective mode display.

FIG. 13 shows another example of the defective mode display. In this example, among contact-holes measured, diameters of contact-holes having bottoms opened are directly displayed.

Figure 14:
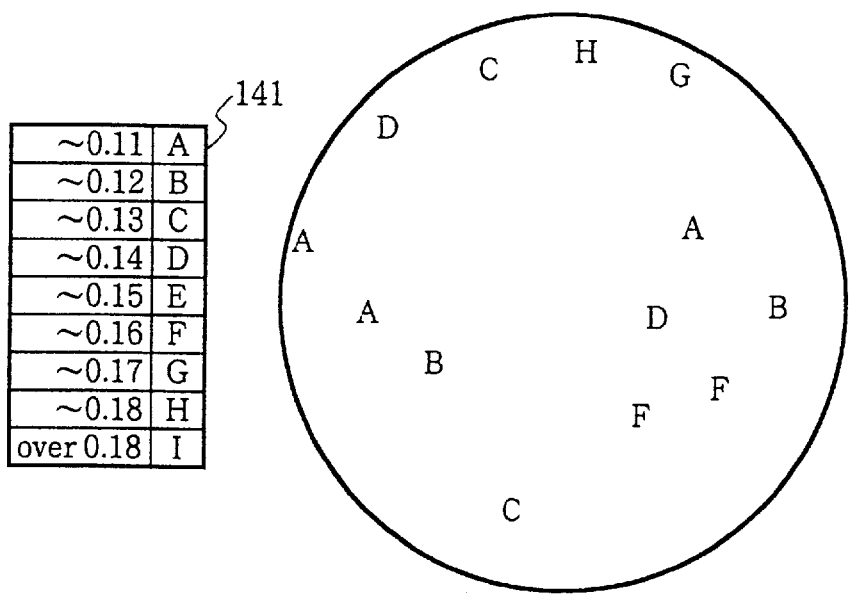
FIG. 14 shows another example of a defective mode display.

FIG. 14 shows another example of the defective mode. In this example, symbols are used for respective ranges of diameter and are displayed in respective locations at which the diameters of the contact-holes are measured. Such display may be effective when the number of measuring points is large. In this case, a correspondence table 141 showing a correspondence between the diameter ranges and the symbols is displayed simultaneously.

Figure 15:
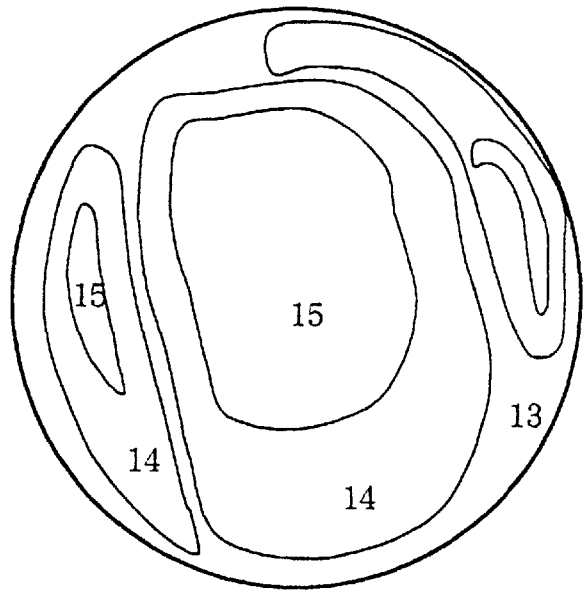
FIG. 15 shows an example of contour display of contact-hole diameter.

FIG. 15 shows an example in which the hole diameter is displayed as contour lines. Since the original object of the test according to the present invention is to know the machining distribution of the etching apparatus, the diameter of contact-hole is displayed as contour lines. In such display, it is possible to geometrically observe the machining distribution to thereby facilitate a trace of the cause of defectiveness. By displaying areas between contour lines with using different colors, the trace of the cause of defectiveness becomes easier.

Figure 16:
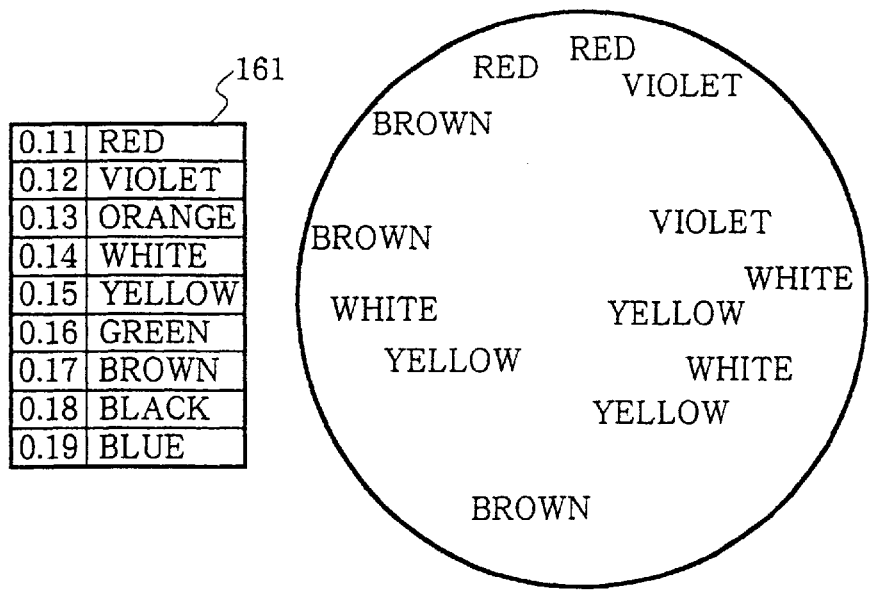
FIG. 16 shows an example of color display of contact-hole diameters with different colors assigned to respective diameter ranges.

FIG. 16 shows an example in which the diameters of contact-holes are displayed with using different colors according to the respective contact-hole ranges. The coloring may be performed for the measuring points. In order to show the values of the contour lines shown in FIG. 15, color or gray scale may be used. In the case of the classification by coloring, a correspondence table 161 showing a correspondence between colors representing the diameters and the diameters is displayed simultaneously.

Figure 17:
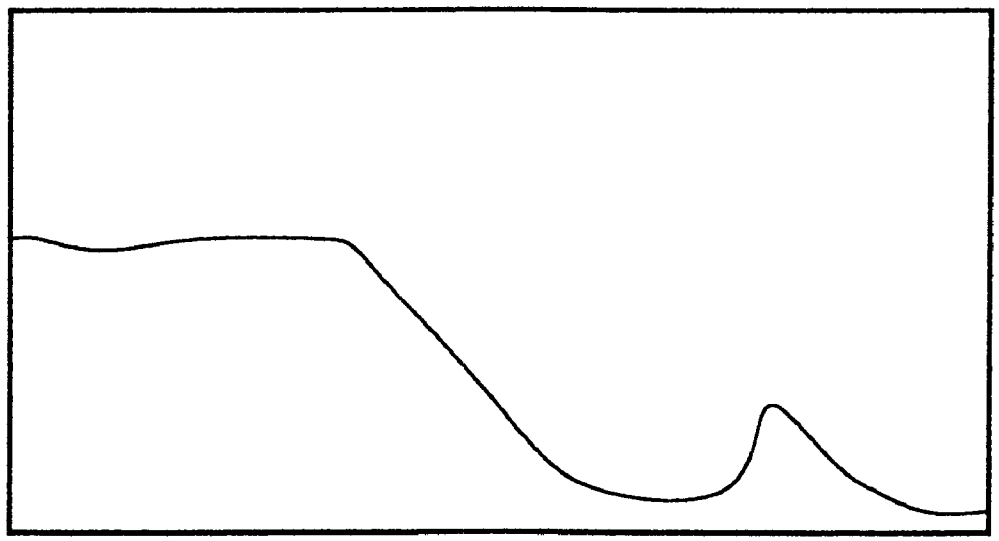
FIG. 17 shows an example of format for displaying amount of current flowing in a substrate when it is irradiated with electron beam or contact-hole diameter after spacial frequency analysis thereof.

FIG. 17 shows an example of the display format of the amount of current flowing in the substrate when the latter is irradiated with electron beam with the hole diameters or the spacial frequency of the hole diameter. This display is useful to know a tendency of the defective distribution when the number of measuring points is large. Particularly, since the defective distribution of etching is considered as being caused by the asymmetry of plasma produced in the etching apparatus, it is possible to extract the feature thereof by investigating the spacial distribution thereof as the frequency. Particularly, since the plasma distribution is changed when the plasma energy is changed, the plasma energy is effective in tracing the change of plasma distribution.

Figure 18:
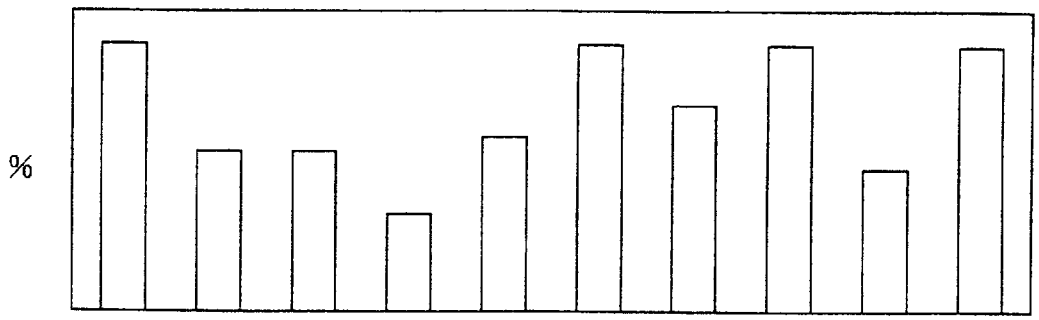
FIG. 18 shows an example of a frequency graph indicating a ratio of contact-hole diameters measured every wafer.

FIG. 18 shows an example of the frequency graph showing the ratio of hole diameter measured every wafer. From this frequency graph, it is possible to see the ratio of holes having diameters within the normal range or the ratio of abnormal holes.

Figure 19:
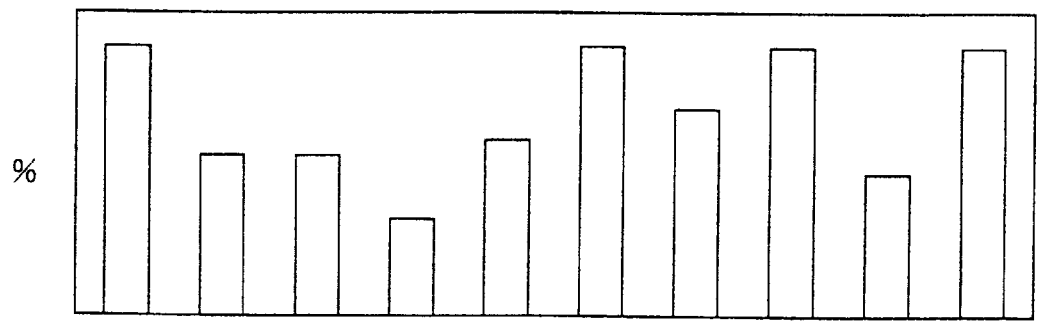
FIG. 19 shows an example of a frequency graph indicating a ratio of contact-hole diameters measured every shot.

FIG. 19 shows an example of the frequency graph showing the ratio of hole diameter measured every shot. From this frequency graph, it is possible to see the ratio of holes having diameters within the normal range or the ratio of abnormal holes.

Figure 20:
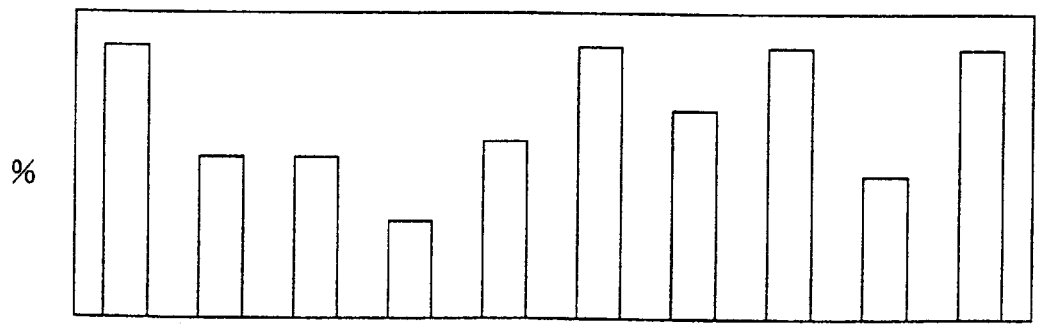
FIG. 20 shows an example of a frequency graph indicating a ratio of contact-hole diameters measured in an arbitrary region.

FIG. 20 shows an example of the frequency graph showing the ratio of hole diameter measured in arbitrarily selected region every chip. From this frequency graph, it is possible to see the ratio of holes having diameters within the normal range or the ratio of abnormal holes.

FIG'S. 21, 22 and 23 show examples of a case where typical statistic values are displayed as tables. In these figures, the maximum value, the minimum value, the average value and 3σ are shown as the statistic values. However, it is possible to display other values such as values of deviation from the in-plane distribution shown by the standard wafer, which is obtained by, for example, least squares method, and/or the amount of deviation from a specific index.

In order to display the stored data after statistic processing thereof, a number of wafers having contact-holes are measured by a single apparatus and resultant data are stored. The following is the statistic processing in such case.

1. The ratio of normal product is obtained every corresponding location and the contour lines are displayed.
2. Wafer groups each including several tens wafers are thrown into the semiconductor fabrication line and one of the wafer groups is usually processed continuously. The changing rates of current of the first and last processed wafers of the one wafer group are contour-displayed or, when data of preceding step is available in the memory device, the condition of contact-hole formation is statistically processed every device used in the preceding step.

Further, it is possible to selectively perform a wafer test from the result of the statistic processing. For example, it is possible to selectively measure only location in which the generation distribution of defective product is high or only location in which the generation distribution of normal product is high, in detail.

Depending upon the structure of device, there is a case where contact-holes having different depths exist. For example, in a structure having a lower insulating layer and an upper insulating layer are formed on a wafer, it is possible to contact-holes having different depths by forming an etching stopper of such as a nitride film on a portion of the lower insulating layer before the upper insulating layer is formed and simultaneously performing an etching of only the upper insulating layer using the etching stopper and an etching for a portion having no etching stopper formed up to the lower insulating layer. In such case, if the contact-holes having different depths are measured simultaneously, there is a possibility that the etching determination for deep contact-hole becomes impossible due to interference of signals from shallow contact-holes. In such case, it is preferable that contact-holes having different depths are classified to a plurality of groups on the basis of the depth of the design data and current is measured by irradiating every group with electron beam. When a result of measurement is displayed on a two-dimensional plane, a design drawing corresponding to the respective depths and a secondary electron image representing a surface are displayed simultaneously so that the measured positions can be confirmed.

In the above description, the present invention is utilized for the test of contact-hole or via-hole. The present invention can be utilized in other discrimination tests or shape measurements for such as through-holes having similar structures, opening portions of resists after exposure and development and opening portions of wiring and/or grooves. Examples of photo resist test to which the present invention is applied will be described.

Since the size of an opening formed in a photo resist is in the order of 0.1 micron, which is smaller than the wavelength of light, and it can not be tested with using light, it has been usual to test such opening by means of an electron microscope. However, in the electron microscope test, which utilizes secondary electron, only a surface portion of the resist opening portion can be observed and it is impossible to determine whether or not the hole penetrates the resist completely. Further, there is a possibility that the resist opening varies due to an amount distribution of exposing light within one shot. However, it is impossible to test on it.

According to the present invention, however, it is possible to test the photo resist in a similar manner to that of the test of contact-hole, provided that an underlying layer is of an electrically conductive material. That is, it is possible to know whether or not the opening penetrates the photo resist completely by measuring current, which is produced by irradiation of the opening portion of the photo resist with electron beam and flows in a substrate, and comparing the current with a standard current. Since the amount of current flowing through the substrate is proportional to the size of the opening, it is possible to measure a distribution of opening size caused by the variation of exposing light by measuring the current produced in the substrate by sequentially irradiating a peripheral portion and a center portion of a shot with electron beam. The underlying layer formed of an electrically conductive material is not limited to a layer immediately below the photo resist in direct contact therewith. The underlying layer may include a structure where there is an insulating layer, which is thin enough to allow electron beam to pass through, between the photo resist and the underlying conductive layer or a case where an electrically conductive layer is exposed by a formation of a hole by etching after a resist mask is formed.

Figure 24:
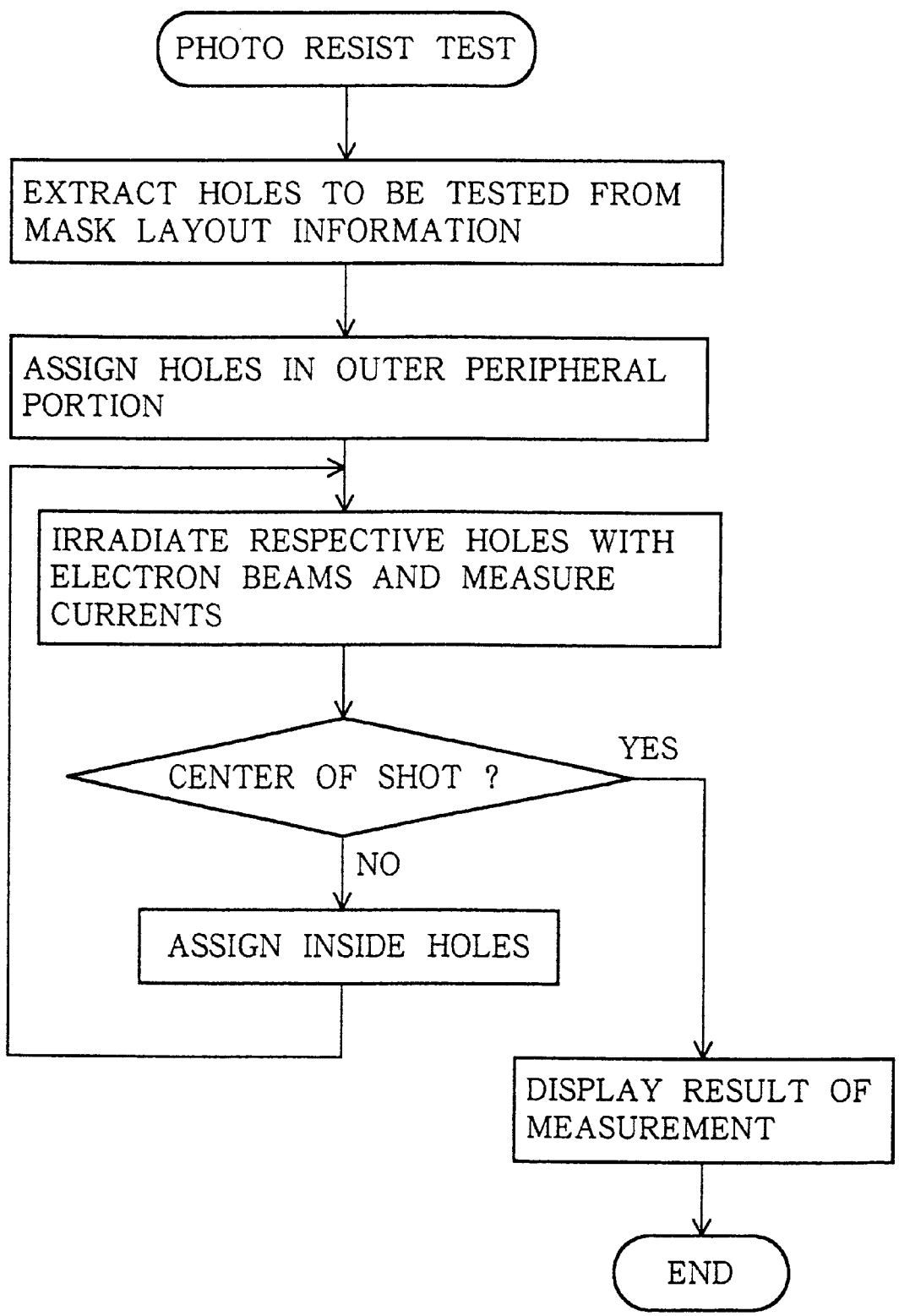
FIG. 24 shows an example of a test flowchart of a photo resist.

FIG. 24 shows an example of a flowchart of a photo resist test. It is usual that a plurality of chips are assigned to one exposing area. Further, holes to be tested are not always arranged in an array. Therefore, holes, which are designed to have the same size, are extracted on the basis of the layout information of a mask used in the exposing step. Then, holes among the extracted holes, which are in an outer peripheral portion of a range exposed in one exposure, are assigned and the assigned holes are irradiated with electron beam. Currents produced in positions of the assigned holes are stored as a function of the hole positions. Then, this procedure is repeated while sequentially changing the hole area inward from the outer peripheral portion to a center portion of the shot. Then, the currents measured are contour-displayed while keeping the geometric relation between the recorded currents and the positions. Instead of the contour display, it may be possible to display the state of exposure by statistically processing a distribution or range of ratio of maximum value to minimum value of measured currents. The measuring sequence of the holes is not limited to that shown in FIG. 24.

Figure 25:
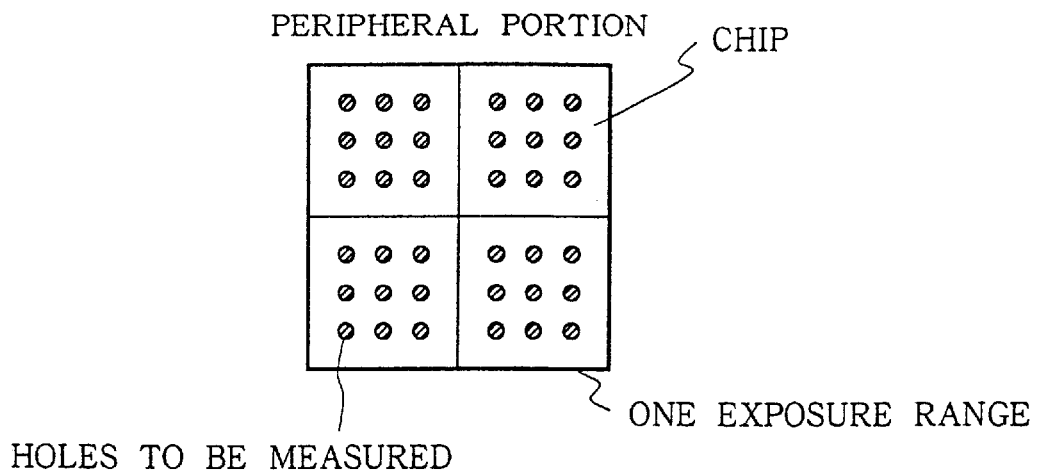
FIG. 25 shows an example of irradiating positions of electron beam when a photo resist test of a memory cell.
Figure 26:
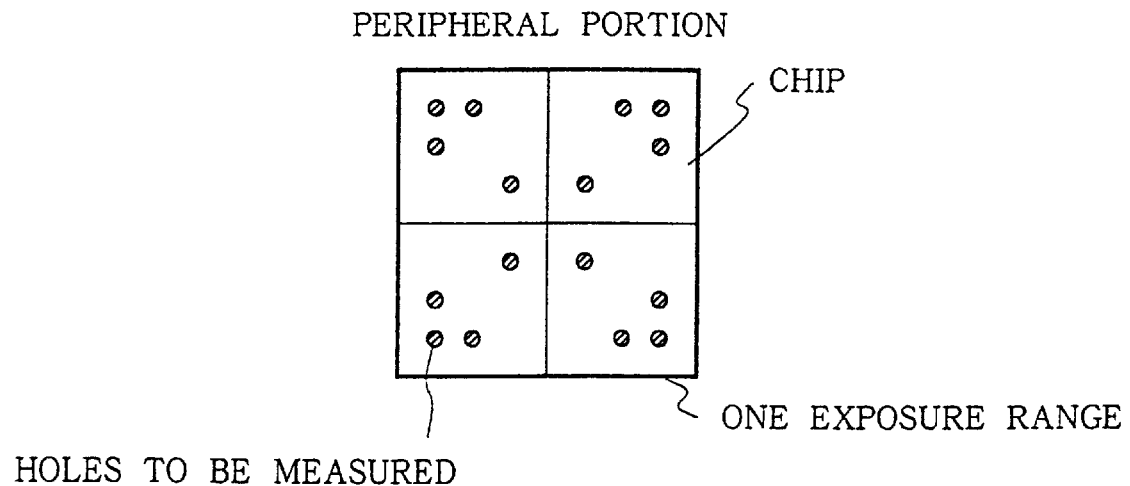
FIG. 26 shows an example of irradiating positions of electron beam when a photo resist test of a logic device.

FIG.'S. 25 and 26 show examples of electron beam irradiating position when the photo resist is to be tested, in which FIG. 25 shows an example of a memory cell in which hole positions are arranged in an array and FIG. 26 shows an example of a logic device in which hole positions are not arranged in an array. In these examples, four chips are include in one exposing area and each chip includes a plurality of trough-holes. The photo resist test is performed for such exposing area.

Figure 27:
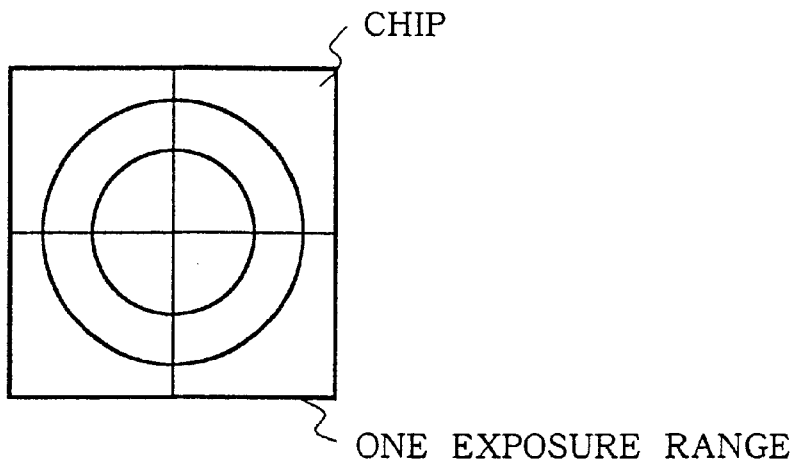
FIG. 27 shows an example of a contour display of current of a result of test.
Figure 28:
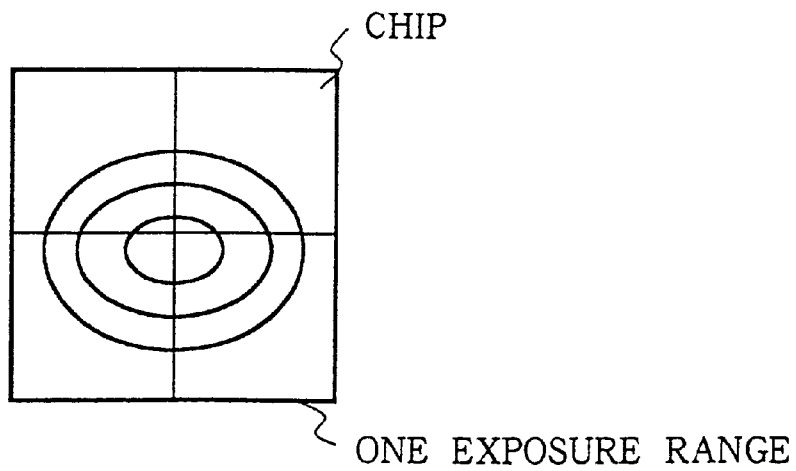
FIG. 28 shows another example of a contour display of current of a result of test.

FIG.'S. 27 and 28 show examples of the contour display of measured currents, in which FIG. 27 shows a case of normal products and FIG. 28 shows a case of defective products. When the exposure is performed uniformly, currents within the shot are substantially uniform. Therefore, the number of contour lines is small. On the other hand, if there is a distribution in exposure, the size of holes formed in the photo resist may vary. Therefore, the measured currents are distributed, causing the number of contour lines to be increased. Further, there may be a deviation in the center.

Particularly, when there is such deviation in the center while the contour lines are concentric circles, it can be known that there is some abnormality such as a tilting of a lens system of the exposing apparatus. On the other hand, when the shapes of the contour lines are distorted and become lateral stripes, the abnormality may be a tilting of the substrate when it is exposed. Further, it is possible to determine whether or not the exposing is performed appropriately by preliminarily setting a range of current distribution or threshold values of the maximum and minimum current values and comparing the measured currents with such values.

Figure 29:
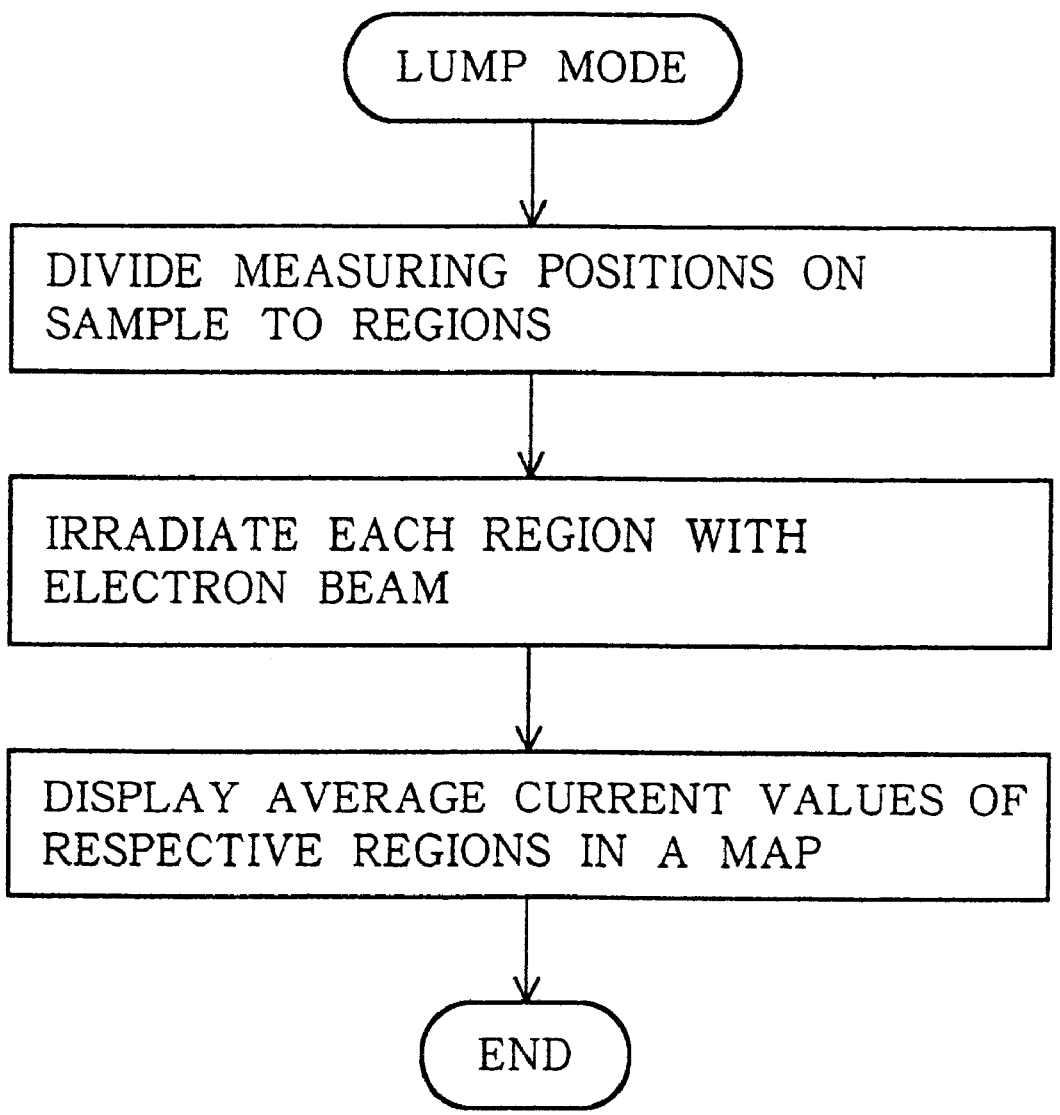
FIG. 29 shows a test flowchart for measuring a plurality of measuring positions as a lump.

FIG. 29 shows a test flowchart for measuring a plurality of measuring positions in a lump. Though the holes in the individual measuring positions are measured one by one in the described embodiments, it is possible to measure currents of holes in a plurality of measuring positions in a lump and obtain an average current value. That is, in FIG. 2, the size of aperture of the aperture plate 13 shown in FIG. 2 is used and a plurality of measuring positions on the sample 14 are divided to a plurality of regions. The control device 2 of the measuring apparatus shown in FIG. 1 controls the electron beam exposing apparatus 1 such that every region is irradiated with electron beam 13 and currents at the measuring positions therein are measured in a lump. The data processor 4 processes the current measured for every region in a lump to obtain an average current value of the region and the average current is displayed on the display device 5.

Figure 30:
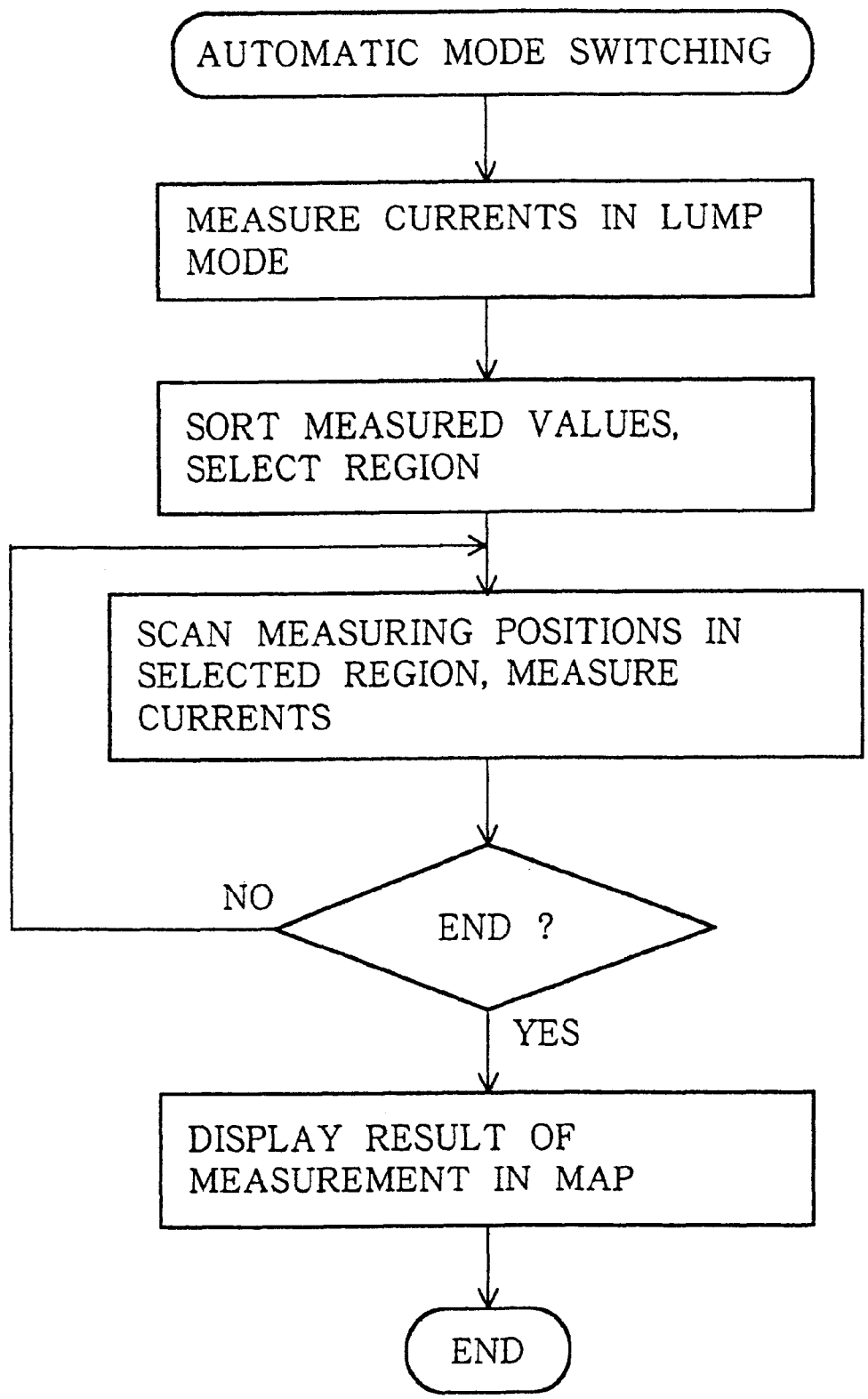
FIG. 30 shows a test flowchart for a measurement while switching a measuring mode between a lump mode and an individual mode for measuring individual measuring positions, respectively.
Figure 31:
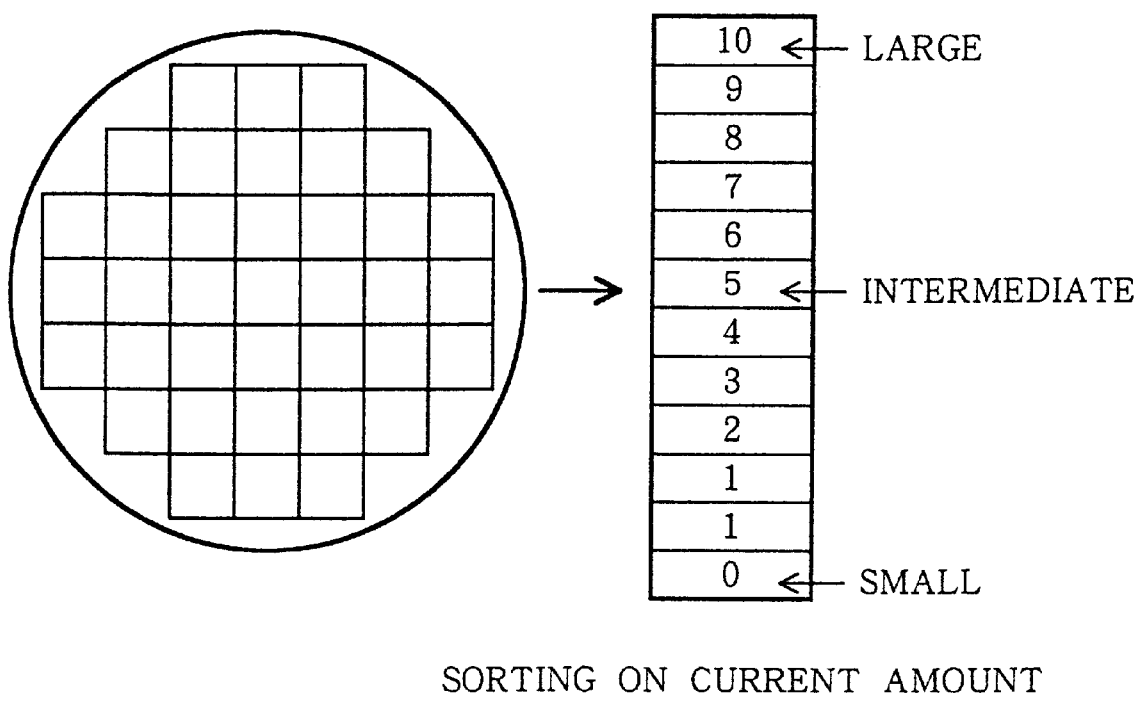
FIG. 31 shows an example of a relation in the lump mode between measuring region and current.

FIG. 30 shows a flowchart of a test in which currents are measured while switching the test mode between the lump mode and the individual mode for measuring currents at individual measuring positions and FIG. 31 shows an example of the measuring regions and currents in the lump mode.

In the test in the lump mode shown in FIG. 29, the measurement is performed for every relatively large region. Therefore, when there is an abnormality in a certain region, it is impossible to decide measuring positions (contact-holes, through-holes, resist holes, wiring and/or grooves) in the region, at which the abnormality occurs. Further, when the density of circuit patterns in these regions are not uniform, the non-uniformity is reflected to a result of measurement. In such case, it is usually necessary to manually test individual measuring positions on the basis of a display on the display device 5. According to the present invention, such test can be done automatically. FIG. 30 shows the flowchart for performing such test automatically.

The test flowchart shown in FIG. 30 will be described with reference to FIG'S. 1 and 2. The operation mode of the electron beam exposing apparatus 1 can be switched under control of the control device 2 between the lump mode in which a plurality of measuring positions on the sample 14 are assigned to a plurality of regions and the measuring positions in every region is irradiated with electron beam 3 in a lump and the individual mode in which the measuring positions are irradiated with electron beam 3 sequentially. The control device 2 sets the measuring mode of the electron beam exposing apparatus 1 to the lump mode. The data processing device 4 displays a result of the measurement on the display device 5. Simultaneously therewith, the data processing device 4 classifies the measured values on the basis of the magnitude thereof, selects some regions according to a predetermined reference and informs the selected regions to the control device 2. The control device 2 sets the operation mode of the electron beam exposing apparatus 1 to the individual mode and repeats the measurement for the selected regions. The measured values thus obtained are processed by the data processing device 4 and displayed on the display device 5. According to this embodiment, it is possible to substantially reduce the test time compared with the case where all of the measuring positions are measured by the individual mode.

In the example shown in FIG. 31, every square region on the wafer is measured in the lump mode and amounts of measured current (standardized in FIG. 31) are sorted in the magnitude order. A large current region having maximum amount of measured current, an intermediate current region having intermediate amount of measured current and a small current region having minimum amount of measured current are selected and are measured in the individual mode. The large, intermediate and small current regions, which are to be measured in the individual mode, may be selected by using other references suitable for the test items. For example, a region having measured current smaller than a predetermined value, a region having measured current larger than the predetermined value and an intermediate region may be used.

Figure 32:
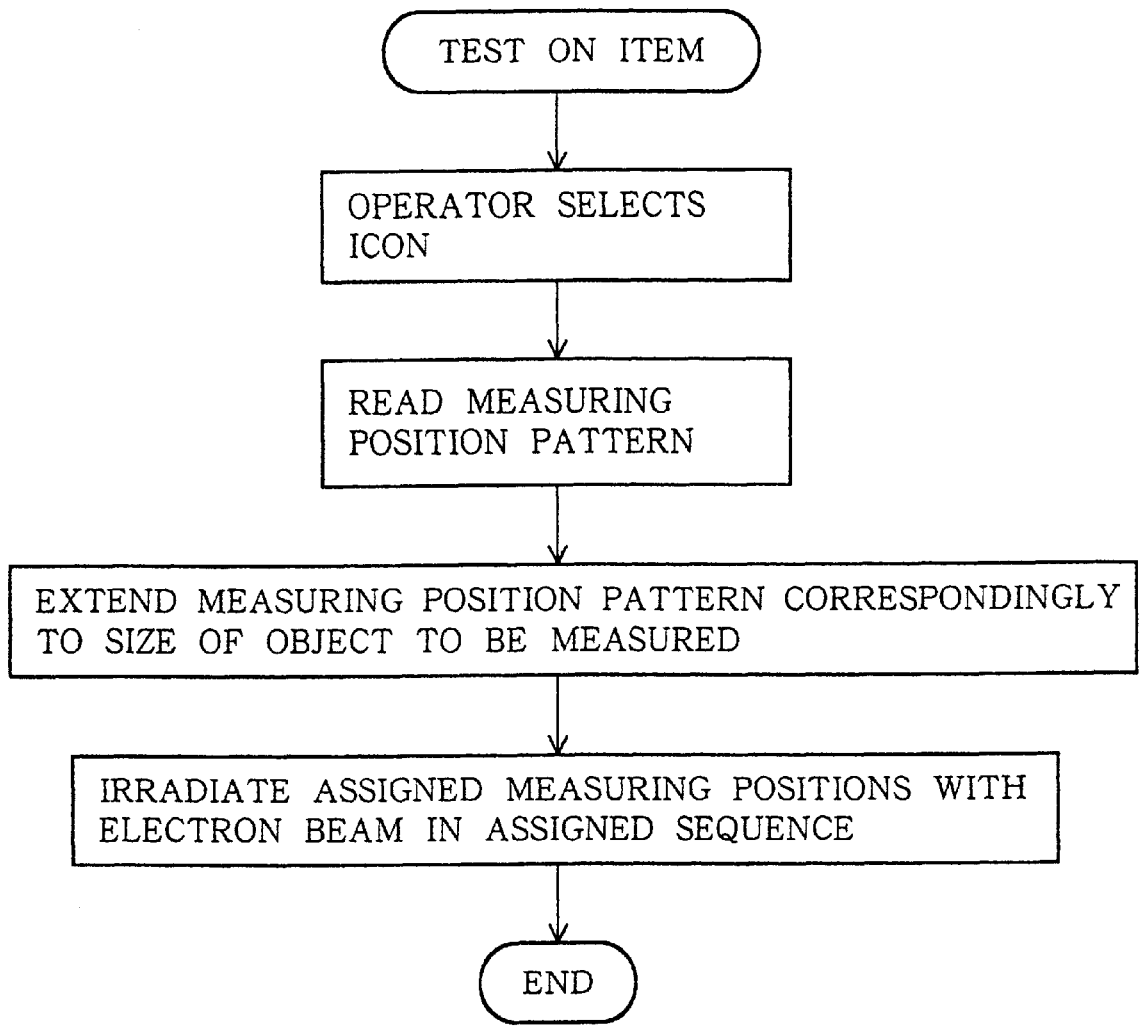
FIG. 32 shows a selection flowchart for selecting measuring position in a case where the plane distribution is measured.
Figure 33A:
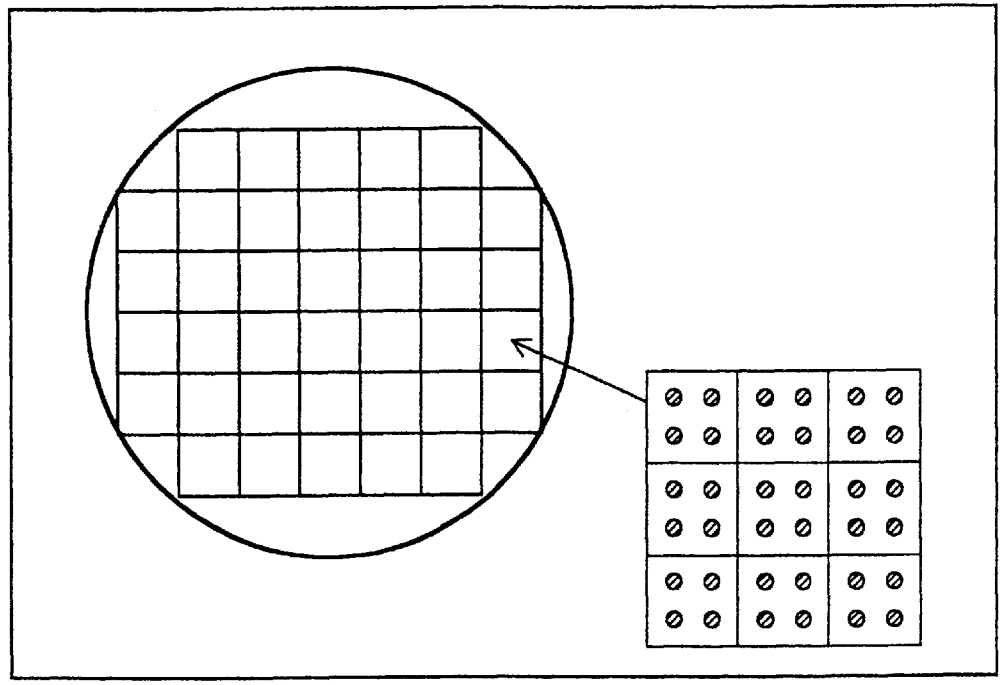
FIG. 33a shows an icon for evaluation of etching variation as an example of icon display and FIG. 33b shows an icon for evaluation of exposure variation as another example of icon display.
Figure 33B:
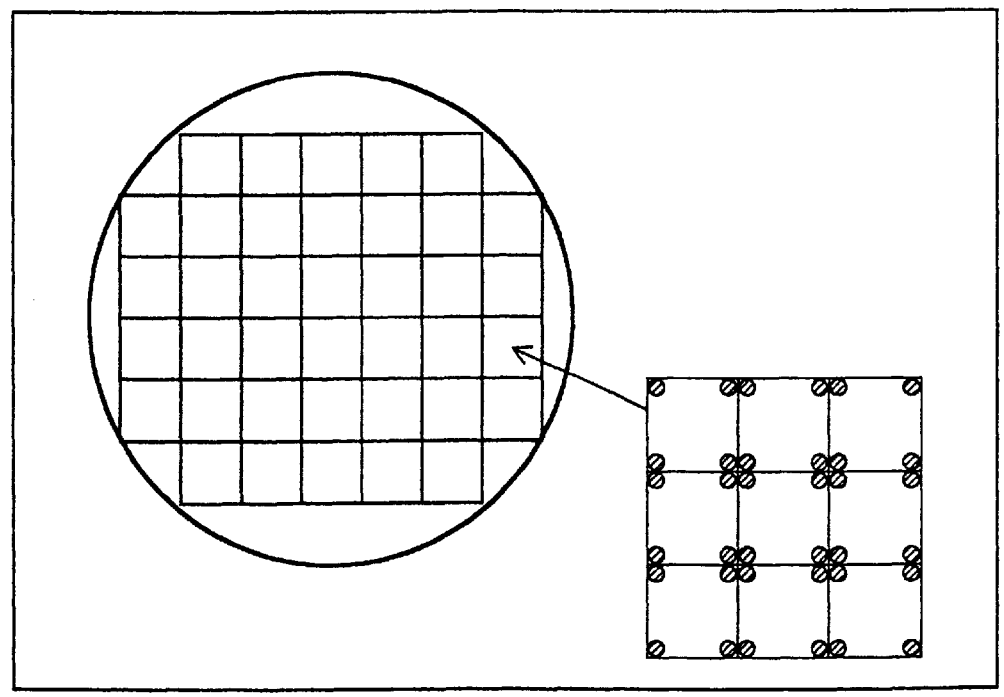

FIG. 32 shows a flowchart for selecting measuring positions when the in-plane distribution is measured and FIGS. 33a and 33b show examples of icon display for the selection.

In the case where the distribution in a plane of a wafer is to be tested, it is unnecessary to test the whole surface of the wafer. As described with reference to FIG'S. 7 to 10, it is enough to measure only typical measuring positions corresponding to the measuring item. It is usual that the electron beam exposing apparatus and/or the electron microscope is equipped with a scheduling function for preliminarily setting the positions to be irradiated with electron beam and the irradiating sequence. Even if such function is utilized, the input is performed by individually assigning coordinates by using ten keys and the setting of the positions and the sequence every test object requires considerable work.

According to the present invention, patterns of measuring positions suitable for the test item and icons with which the contents thereof can be recognized visually are registered in the memory 3 shown in FIG. 1 and the icons are displayed on the display device 5 as a test item selection display. An operator can set a test condition by selecting a corresponding icon display on the display device 5. The control device 2 reads out a measuring position pattern corresponding to the icon selected by the operator from the memory 3, converts the measuring position pattern into coordinates, in which the test is performed actually, by extending the measuring position pattern correspondingly to a size of object to be measured. On the basis of the actual coordinates thus obtained, the control device 2 controls the electron beam exposing apparatus 1 such that the assigned measuring positions are irradiated with electron beam in the assigned sequence.

FIG. 33a shows an example of the icon for evaluation of etching variation and FIG. 33b shows an example of the icon for evaluation of exposure variation. Other measuring position patterns may be used. For example, a pattern of specific circuits distributed on a wafer may be considered and, when tests for the evaluation of etching variation and the exposing evaluation are performed in line of a mass production, measuring positions may be thinned and measuring positions in which there is no defect may be tested in detail.

Figure 34:
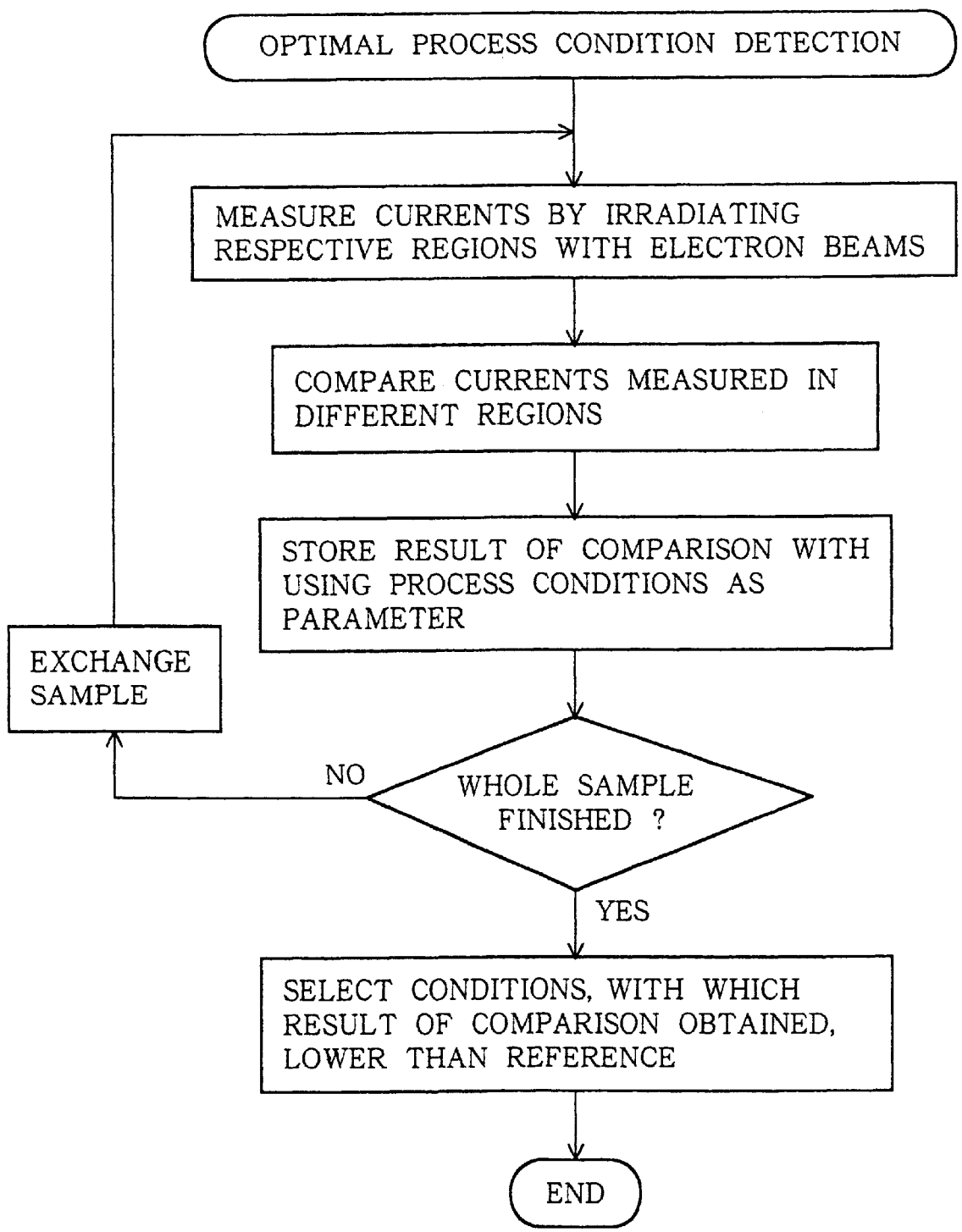
FIG. 34 shows a detection flowchart as an example of utilization of the present invention.

FIG. 34 shows an example of utilization of the present invention, which is a detection flowchart for determining a process condition for mass production.

The evaluation of process variation such as etching is performed by measuring current produced by irradiating a sample with electron beam as mentioned above. This can be utilized to determine the process condition for mass production. In such case, it should be noted that process condition in a case where holes and/or wiring are formed discretely is different from that in a case where holes and/or wiling are aggregated densely. In a case of etching, for example, it has been known that densely aggregated holes are easily etched compared with discretely formed holes. Under an optimal condition, the discrete holes and densely aggregated holes are etched uniformly.

An example of the case where the etching condition is determined by the detection flowchart shown in FIG. 34 will be described with reference to the apparatus shown in FIG'S. 1 and 2. A plurality of samples 14, which are formed under different etching conditions and each of which is formed with discrete holes in a certain region thereof and with densely aggregated holes in another region, are prepared. The control device 2 controls the electron beam exposing apparatus 1 to measure currents by irradiating the region of the discrete holes and the region of the densely aggregated holes with electron beam. The data processing device 4 compares the measured currents and stores a result of comparison with using the etching conditions as a parameter. From the result of comparison, one of the etching conditions, under which the result of comparison is lower than a reference, is selected as the optimal etching condition.

Figure 35:
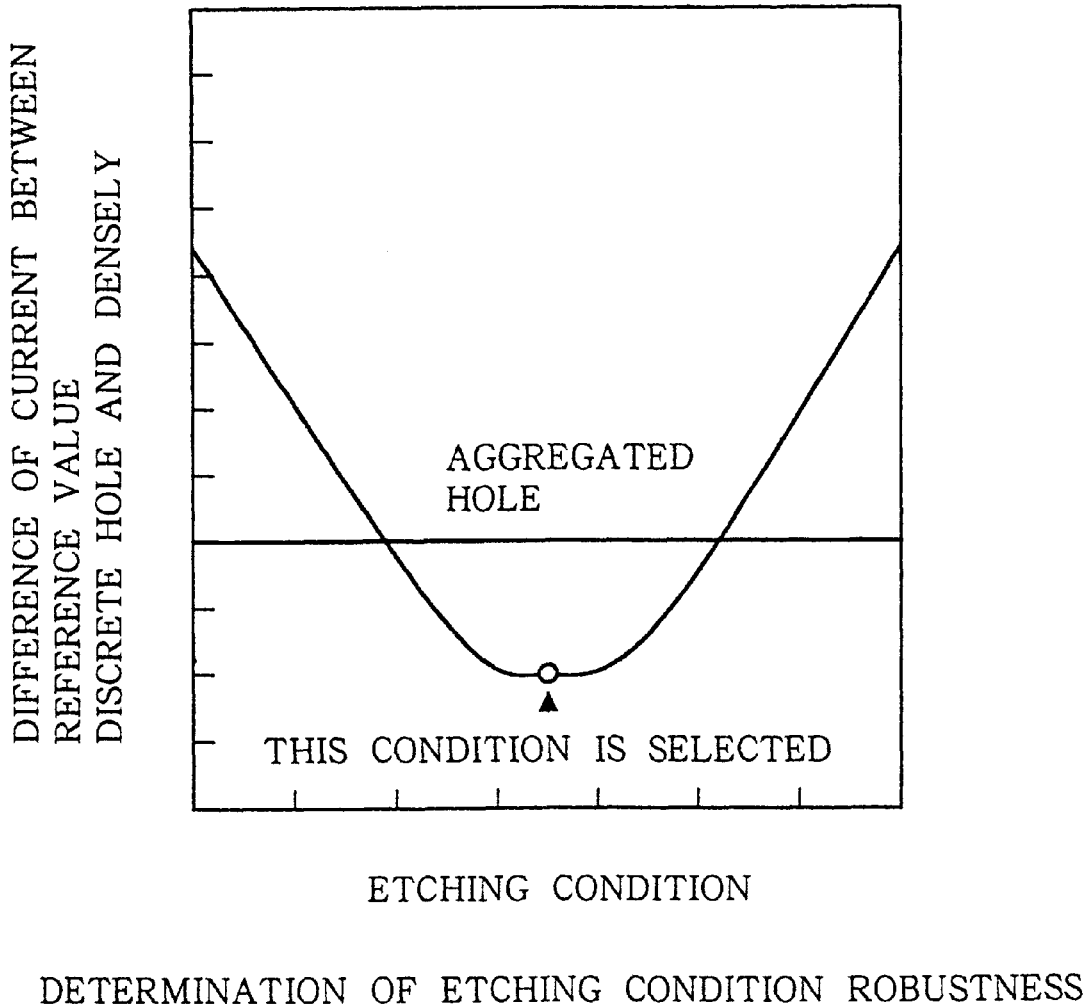
FIG. 35 shows an example of selection of etching condition.

FIG. 35 shows an example of the selection of the etching condition. A center condition of the etching conditions under which a difference between the current measured for the discrete holes and the current measured for the densely aggregated holes is smaller than a reference value is selected.

The measurement of current for the densely aggregated holes may be done for one of the holes. Alternatively, an average value of currents measured for a plurality of densely aggregated holes may be used or it is possible to obtain a current per hole by standardizing currents flowing through a plurality of densely aggregated holes with the number of the holes. The current of one hole thus obtained is compared with a current flowing through one discrete hole. The process condition for the wiring pattern can be determined similarly. It may be possible to perform tests for a first region in which holes or wiring patterns are formed with relatively high-density, a second region in which holes or wiring patterns are formed with relatively low density and a third region in which holes or wiring patterns are formed discretely.

Figure 36:
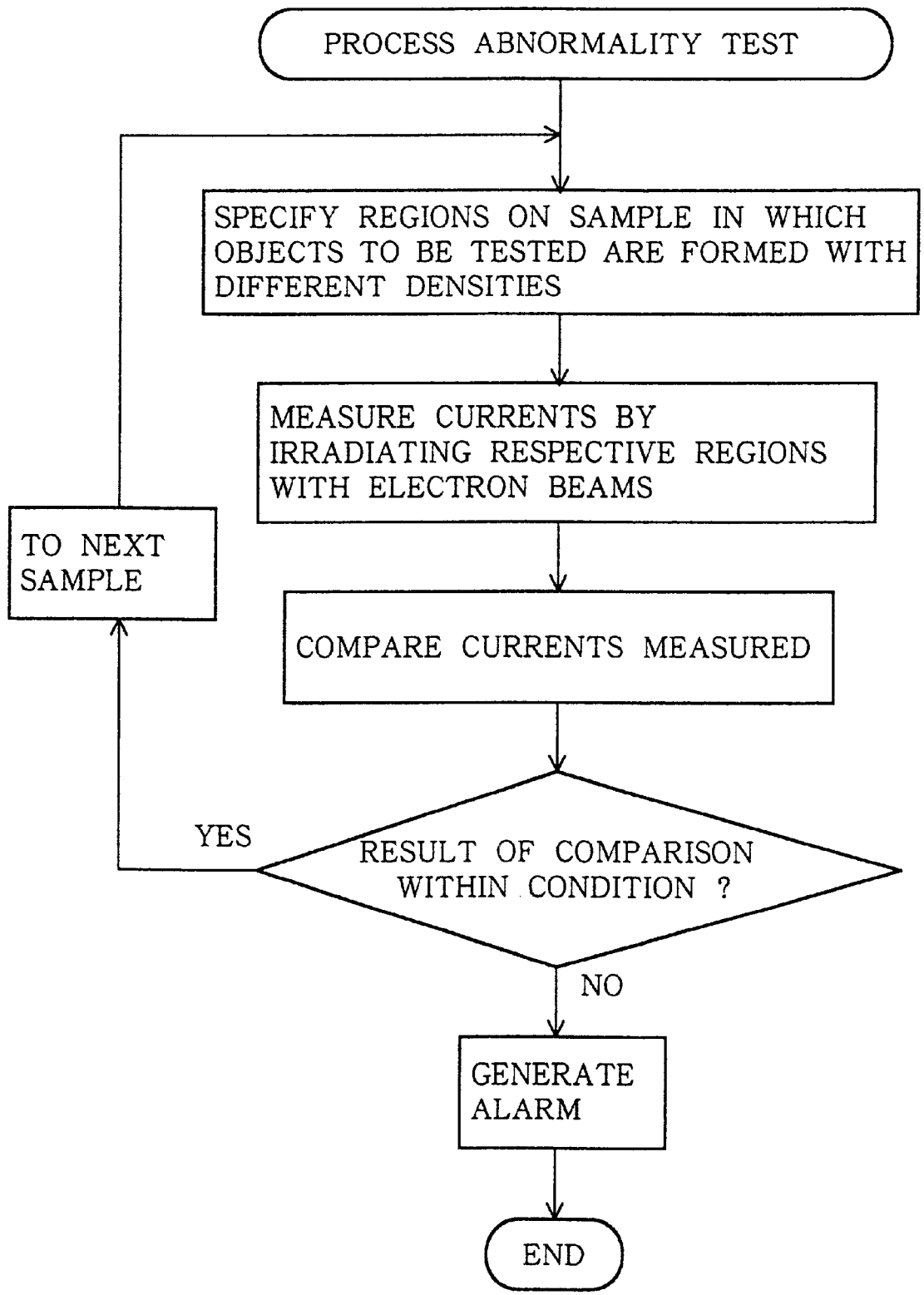
FIG. 36 shows a test flowchart as an example of utilization of the present invention.

FIG. 36 shows another example of the case where the etching condition is determined by the detection flowchart for detecting a process abnormality in a mass production. An example of the detection of process abnormality in the mass production will be described with reference to the apparatus shown in FIG'S. 1 and 2. In order to perform this test, the control device 2 preliminarily specifies positions of densely formed holes and positions of discrete holes of a sample 14, by using CAD data and currents produced in the respective holes when irradiated with electron beam are measured. The data processing device 4 compares the measured currents and, when a result of comparison does not satisfy a predetermined condition, decides that the etching step performed for the sample is abnormal and alarms the display device 5 of the abnormality.

Figure 37:
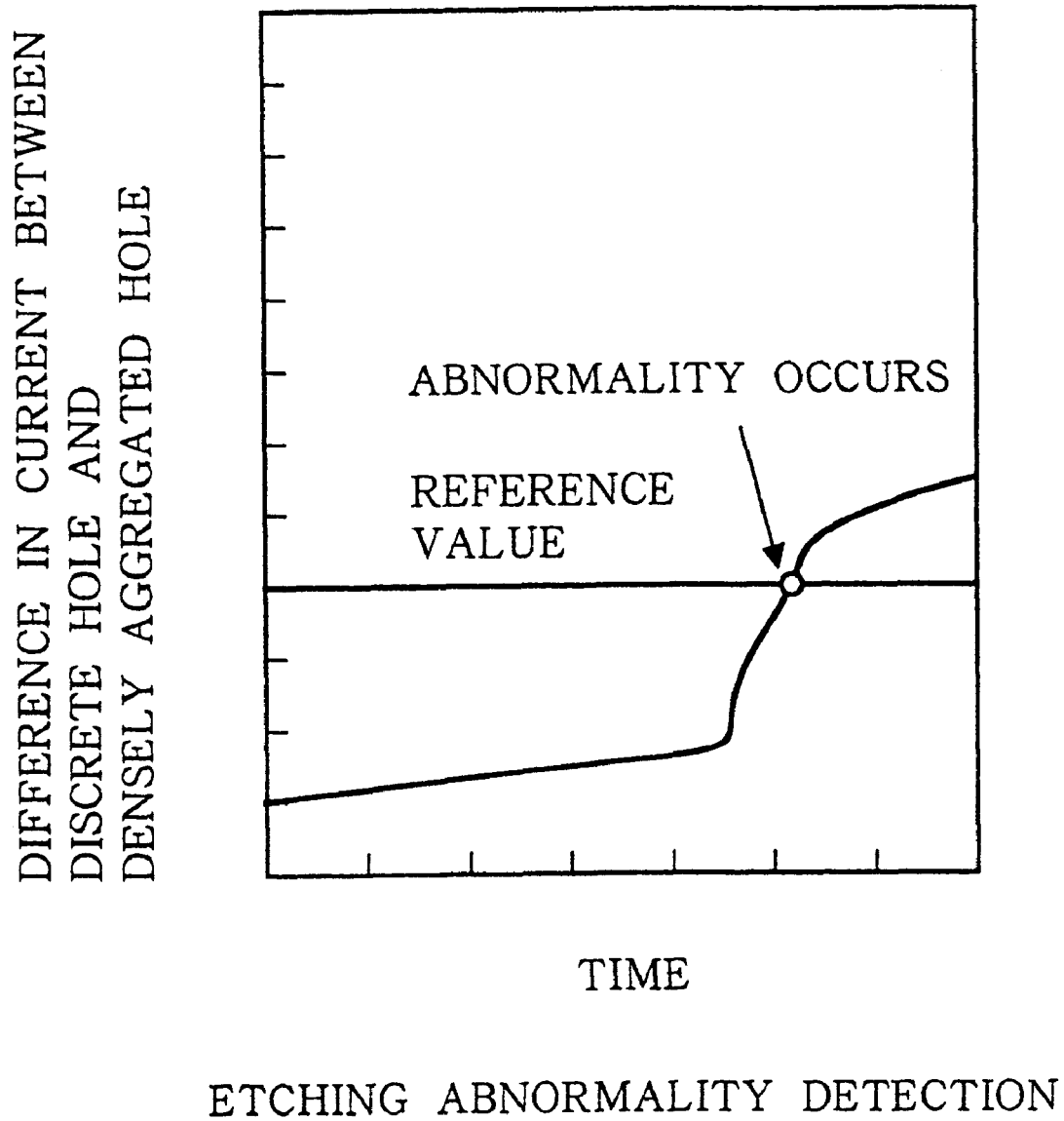
FIG. 37 shows an example of an alarm generating condition.

FIG. 37 shows an example of the alarm generating condition. When a difference between the current measured for the discrete holes and the current measured for the densely aggregated holes exceeds a reference value, it is possible to decide that an abnormality is generated.

In this test, it is also possible to measure a current for one of the densely aggregated holes. Alternatively, an average value of currents measured for a plurality of densely aggregated holes may be used or it is possible to obtain a current per hole by standardizing currents flowing through a plurality of densely aggregated holes with the number of the holes. The current of one hole thus obtained is compared with a current flowing through one discrete hole. The process condition for the wiring pattern can be determined similarly. It may be possible to perform tests for a first region in which holes or wiring patterns are formed with relatively high density, a second region in which holes or wiring patterns are formed with relatively low density and a third region in which holes or wiring patterns are formed discretely. When the current measured for the discrete holes or dense holes is smaller than a reference value, it is possible to add a further etching step.

As described hereinbefore, according to the device tester and the test method of the present invention, a sample can be tested non-destructively and a result of test can be displayed as a map correspondingly to measuring points. Particularly, when the present invention is applied to the test of contact-holes, diameters of bottom portions of the contact-holes can be obtained non-destructively and display them on a wafer map corresponding to positional coordinates of the measuring points. This is advantageous compared with the prior art measurement of the bottom diameter in which a sample is cut and a cross section thereof is observed. Since contour lines can be obtained, it is possible to visually confirm a plasma distribution from a pattern of the contour lines, so that it is possible to specify a cause of abnormality. Further, the present invention can be utilized in not only the test of contact-hole or via-hole but also other discrimination tests or shape measurements for such as through-holes having similar structures, opening portions of resists after exposure and development and opening portions of wiring and/or grooves. Similarly, it is possible to test configurations and/or states of bottom portions of holes after etching process or washing process.

Since the present invention can perform the non-destructive test, the information of bottoms of holes can be obtained without observing a cross section of a sample by means of SEM. Therefore, it is possible to directly measure products without using a monitor wafer to thereby reduce the test process cost.

Further, since an area or diameter of a bottom of a contact-hole on the way of fabrication can be measured from a measured current at high speed in analog sense by conversion, it is possible to improve the process on that occasion. For example, when the etching condition is to be decided, it is necessary to control both a shape of an opening of a contact-hole and a shape of a bottom thereof. According to the present invention, however, it is possible to measure a diameter distribution of contact-holes in a whole wafer immediately. Further, it is possible in the prior art test to determine the quality of contact-hole only when the contact-hole does not completely penetrate an insulating film. In the present invention, however, it is possible to monitor whether or not a contact-hole penetrates an insulating film and to monitor a diameter of a bottom of a through-hole. Therefore, it is possible to detect a change of a diameter of an opening of the contact-hole before the opening is closed. Consequently, it is possible according to the present invention to find an abnormality of a contact-hole sufficiently before the opening defect of the contact-hole occurs to thereby perform a maintenance operation of a process machine before defects of a semiconductor device occur practically. Since it is possible to generate a signal for automatically interrupting the etching apparatus when the abnormality detection occurs, it is possible to automatically collect a maintenance information of the etching apparatus by utilizing the interrupting signal.

It is possible to determine the quality of contact-hole by using not an individual information of holes but a statistical value of distribution or a deviation from a standard value. Therefore, according to the present invention, it is possible to select wafers in-line, which is impossible in the prior art, to thereby optimize an amount of wafer supply to the fabrication apparatus.

Measured current may be displayed in a map without using any conversion, if current can be displayed in map.

What is claimed is:

1. A semiconductor tester comprising:

means for sequentially irradiating a plurality of measuring positions on a sample with electron beams having identical cross sectional shapes, wherein said sample is a semiconductor wafer formed with one or a plurality of contact-holes, via holes, grooves or opening portions of a resist, means for measuring a current produced in said sample when individual measuring positions are irradiated with an electron beam, and display means for evaluating measured currents or physical amounts derived from the measured currents and displaying symbols on a two-dimensional plane simulating a wafer shape as a function of measuring position to classify dimensions of the contact-holes, via holes, grooves or opening portions of a resist.

2. The semiconductor tester as claimed in claim 1, wherein said measuring means measures a total amount of currents produced when said individual measuring positions of said sample are irradiated with electron beam.

3. The semiconductor device tester as claimed in claim 1, wherein said irradiating means-irradiates positions of said semiconductor wafer, which are arranged along an arbitrary axis crossing said wafer with a predetermined interval, with an electron beam.

4. The semiconductor device tester as claimed in claim 3, wherein the predetermined interval is an interval having a constant period.

5. The semiconductor device tester as claimed in claim 3, wherein said irradiating means irradiates positions having a predetermined interval in a shot region exposed in one stepper exposure with electron beam.

6. The semiconductor device tester as claimed in claim 3, wherein said irradiating means irradiates positions having a predetermined interval along an arbitrary axis passing through a scribe region determining a region of one semiconductor device with electron beam.

7. The semiconductor device tester as claimed in claim 3, wherein said display means includes means for evaluating an amount of current in each of the measuring positions according to a quality determination algorithm determined for every semiconductor device and displaying specific symbols on a two-dimensional plane simulating a wafer shape correspondingly to normal or defective positions.

8. The semiconductor device tester as claimed in claim 7, wherein said display means includes means for displaying a specific symbol corresponding to a defective mode according to the defective mode determined every semiconductor device.

9. The semiconductor device tester as claimed in claim 3, wherein said display means includes means for evaluating an amount of current in each of the measuring positions according to a quality determination algorithm determined for every semiconductor device and displaying values or substantial values of diameters of contact-holes on a two-dimensional plane simulating a wafer shape correspondingly to the measuring positions.

10. The semiconductor device tester as claimed in claim 9, wherein said display means includes means for displaying symbols indicating a range of the contact-hole diameter.

11. The semiconductor device tester as claimed in claim 10, wherein said display means includes means for displaying the range of the contact-hole diameter as contour lines.

12. The semiconductor device tester as claimed in claim 10, wherein said display means includes means for displaying colors indicating ranges of values of the contact-hole diameters.

13. The semiconductor device tester as claimed in claim 9, wherein said display means includes means for calculating spacial frequency of measured currents and displaying a magnitude of measured currents corresponding to spacial frequencies on a two-dimensional plane.

14. The semiconductor device tester as claimed in claim 9, wherein said display means includes means for displaying a ratio of contact-hole diameter every wafer as a function of the contact-hole diameter.

15. The semiconductor device tester as claimed in claim 9, wherein said irradiating means is constructed with electron beam irradiating means having a stepper exposing device and said display means includes means for displaying a ratio of contact-hole diameter every shot of the stepper exposure as a function of the contact-hole diameter.

16. The semiconductor device tester as claimed in claim 9, wherein said display means includes means for displaying a ratio of contact-hole diameter for every chip on a wafer as a function of the contact-hole diameter.

17. The semiconductor device tester as claimed in claim 9, means includes means for displaying a statistical amount of maximum diameter, minimum diameter, average diameter, standard deviation and/or deviation from a standard diameter of the contact-hole for every wafer.

18. The semiconductor device tester as claimed in claim 1, wherein said semiconductor wafer is an electrically conductive substrate having a photo resist formed on a surface thereof and formed with holes, further comprising means for extracting holes having the same designed size from a layout information of a mask used in exposure and assigning holes to be tested for every chip within a range, which is exposed simultaneously when it is exposed during the exposure of the photo resist.

19. The semiconductor device tester as claimed in claim 1, wherein said semiconductor wafer is an element having holes having different depths and further comprising means for classifying said holes for every depth thereof on a basis of design data and controlling said irradiating means such that said holes in each group are irradiated with an electron beam.

20. The semiconductor device tester as claimed in claim 19, wherein said display means includes means for simultaneously displaying a design sheet corresponding to depths of said respective holes and a secondary electron image representing a surface of the semiconductor wafer.

21. The semiconductor device tester as claimed in claim 1, further comprising means for controlling said irradiating means such that a plurality of measuring positions on said semiconductor wafer are classified to a plurality of regions and every region is irradiated with an electron beam, wherein said display means includes average value display means for displaying an amount of current measured in every region as an average amount of currents obtained in a plurality of measuring positions contained in the region.

22. The semiconductor device tester as claimed in claim 1, wherein said irradiating means is capable of switching an operation mode between a first mode in which the plurality of measuring positions classified to a plurality of regions and every region is irradiated with an electron beam and a second mode in which individual measuring positions are irradiated with an electron beam, further comprising control means for setting said irradiating means to the first mode, classifying the amounts of currents measured by said measuring means according to the magnitudes thereof, selecting some of the regions according to a predetermined reference, setting said irradiating means to the second mode for the selected regions and repeating the measurement.

23. The semiconductor device tester as claimed in claim 1, further comprising:
   memory means for storing measuring position patterns suitable for items to be tested,
   means for reading one of the measuring position patterns from said memory means corresponding to a test item selected by an operator, converting the measuring positions into coordinates for which the test is performed practically by extending the measuring pattern suitably for the size of an object to be measured, and
   means for controlling said irradiating means such that the measuring positions assigned are irradiated with an electron beam in an assigned sequence thereof on the basis of the practical coordinates obtained by said converting means.

24. The semiconductor device tester as claimed in claim 1, wherein said semiconductor wafer includes a plurality of test samples, which are formed by using mutually different process conditions and contain a plurality of regions in which test objects are formed in different densities, further comprising:
   means for comparing the amounts of currents measured by said measuring means when the plurality of the regions are irradiated with an electron beam between process conditions,
   memory means for storing a result of comparison from said comparing means using process conditions used for the test samples as parameters, and means for selecting an optimal process condition from a result of comparison related to a plurality of the test samples stored in said memory means.

25. The semiconductor device tester as claimed in claim 24, wherein the plurality of the regions include first regions in which the objects to be tested are formed in high density and second regions in which the objects to be tested are formed discretely.

26. The semiconductor device tester as claimed in claim 25, wherein said comparing means includes means for comparing an amount of current flowing in one hole within the first region with an amount of current flowing in one discrete hole within the second region.

27. The semiconductor device tester as claimed in claim 25, wherein said comparing means includes means for comparing an amount of current flowing in one hole within the first region with an amount of current flowing in one discrete hole.

28. The semiconductor device tester as claimed in claim 25, wherein the objects to be tested include wiring patterns.

29. The semiconductor device tester as claimed in claim 24, wherein the plurality of regions include a first region in which objects to be tested are formed in relatively high density, a second region, in which objects to be tested in relatively low density and a third region in which discrete objects are formed.

30. The semiconductor device tester as claimed in claim 1, further comprising:

means for specifying a plurality of regions of the semiconductor wafer in which objects to be tested in different densities, means for comparing currents measured by said measuring means when the plurality of regions are irradiated with electron beam, respectively, and means for alarming a fabrication step performed for the semiconductor wafer as abnormal when the result of comparison from said comparing means does not satisfy a predetermined condition.

31. A test method of a semiconductor device comprising:

a first step of measuring currents flowing in a sample by irradiating a plurality of measuring positions on the sample with electron beams sequentially such that the electron beams have identical cross sectional shapes and storing the respective measuring positions and the measured currents, wherein said sample is a semiconductor wafer formed with one or a plurality of contact-holes, via holes, grooves or opening portions of a resist, and a second step of reading the currents and the measuring positions, evaluating the currents or physical amount derived from the currents, and displaying symbols on a two dimensional plane simulating a wafer shape as a function of the measuring positions in a manner to classify the contact-holes, via holes, grooves or opening portions of a resist.

* * * * *